US010256112B1

(12) United States Patent
Wang et al.

(10) Patent No.: US 10,256,112 B1
(45) Date of Patent: Apr. 9, 2019

(54) SELECTIVE TUNGSTEN REMOVAL

(71) Applicant: APPLIED MATERIALS, INC., Santa Clara, CA (US)

(72) Inventors: Xikun Wang, Sunnyvale, CA (US); Nitin Ingle, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 15/835,731

(22) Filed: Dec. 8, 2017

(51) Int. Cl.

| | |
|---|---|
| ***H01L 21/321*** | (2006.01) |
| ***H01L 21/3213*** | (2006.01) |
| ***C23C 28/04*** | (2006.01) |
| ***C23C 16/01*** | (2006.01) |
| ***H01L 21/02*** | (2006.01) |
| ***H01L 21/3065*** | (2006.01) |
| ***H01L 21/768*** | (2006.01) |
| ***H01L 21/285*** | (2006.01) |

(52) U.S. Cl.
CPC ........ *H01L 21/32136* (2013.01); *C23C 16/01* (2013.01); *C23C 28/042* (2013.01); *H01L 21/02175* (2013.01); *H01L 21/28556* (2013.01); *H01L 21/3065* (2013.01); *H01L 21/76865* (2013.01); *H01L 2924/01074* (2013.01)

(58) Field of Classification Search
CPC ................................................ H01L 21/32136
USPC ......................................................... 216/719
See application file for complete search history.

(56) References Cited

U.S. PATENT DOCUMENTS

| | | | |
|---|---|---|---|
| 2,369,620 | A | 2/1945 | Sullivan et al. |
| 3,401,302 | A | 9/1968 | Thorpe |
| 3,451,840 | A | 6/1969 | Hough |
| 3,537,474 | A | 11/1970 | Rohrer |
| 3,756,511 | A | 9/1973 | Shinroku |
| 3,937,857 | A | 2/1976 | Brummett et al. |
| 3,969,077 | A | 7/1976 | Hill |
| 4,006,047 | A | 2/1977 | Brummett et al. |

(Continued)

FOREIGN PATENT DOCUMENTS

| | | | |
|---|---|---|---|
| CN | 1124364 | A | 6/1996 |
| CN | 1847450 | A | 10/2006 |

(Continued)

OTHER PUBLICATIONS

International Search Report and Written Opinion of PCT/US2018/016261 dated May 21, 2018, all pages.

(Continued)

*Primary Examiner* — Roberts P Culbert
(74) *Attorney, Agent, or Firm* — Kilpatrick Townsend & Stockton LLP

(57) ABSTRACT

Exemplary methods for removing tungsten-containing material may include flowing a chlorine-containing precursor into a processing region of a semiconductor processing chamber. The methods may also include flowing methane into the processing region of the semiconductor processing chamber. The methods may include forming a plasma from the chlorine-containing precursor and the methane to produce plasma effluents. The methods may also include contacting a substrate with the plasma effluents. The substrate may include an exposed region of a tungsten-containing material. The plasma effluents may produce an oxychloride of tungsten. The methods may also include recessing the exposed region of the tungsten-containing material.

19 Claims, 5 Drawing Sheets

(56) References Cited

U.S. PATENT DOCUMENTS 4,190,488 A 2/1980 Winters
4,209,357 A 6/1980 Gorin et al.
4,214,946 A 7/1980 Forget et al.
4,232,060 A 11/1980 Mallory, Jr.
4,234,628 A 11/1980 DuRose
4,265,943 A 5/1981 Goldstein et al.
4,340,462 A 7/1982 Koch
4,341,592 A 7/1982 Shortes et al.
4,361,418 A 11/1982 Tscheppe
4,361,441 A 11/1982 Tylko
4,364,803 A 12/1982 Nidola et al.
4,368,223 A 1/1983 Kobayashi et al.
4,374,698 A 2/1983 Sanders et al.
4,397,812 A 8/1983 Mallory, Jr.
4,468,413 A 8/1984 Bachmann
4,565,601 A 1/1986 Kakehi et al.
4,579,618 A 4/1986 Celestino et al.
4,585,920 A 4/1986 Hoog et al.
4,610,775 A 9/1986 Phifer
4,625,678 A 12/1986 Shloya et al.
4,632,857 A 12/1986 Mallory, Jr.
4,656,052 A 4/1987 Satou et al.
4,656,076 A 4/1987 Vetanen et al.
4,668,335 A 5/1987 Mockler
4,690,746 A 9/1987 McInerney et al.
4,715,937 A 12/1987 Moslehi et al.
4,749,440 A 6/1988 Blackwood et al.
4,753,898 A 6/1988 Parrillo et al.
4,786,360 A 11/1988 Cote et al.
4,792,378 A 12/1988 Rose et al.
4,793,897 A 12/1988 Dunfield et al.
4,807,016 A 2/1989 Douglas
4,810,520 A 3/1989 Wu
4,816,638 A 3/1989 Ukai et al.
4,820,377 A 4/1989 Davis et al.
4,828,649 A 5/1989 Davis
4,857,140 A 8/1989 Loewenstein
4,867,841 A 9/1989 Loewenstein et al.
4,904,621 A 2/1990 Loewenstein et al.
4,913,929 A 4/1990 Moslehi et al.
4,919,750 A 4/1990 Bausmith et al.
4,946,903 A 8/1990 Gardella et al.
4,951,601 A 8/1990 Maydan et al.
4,960,488 A 10/1990 Law et al.
4,980,018 A 12/1990 Mu et al.
4,981,551 A 1/1991 Palmour
4,985,372 A 1/1991 Narita et al.
4,991,542 A 2/1991 Kohmura et al.
4,992,136 A 2/1991 Tachi et al.
4,993,358 A 2/1991 Mahawili
4,994,404 A 2/1991 Sheng et al.
5,000,113 A 3/1991 Wang et al.
5,006,192 A 4/1991 Deguchi
5,010,842 A 4/1991 Oda et al.
5,013,691 A 5/1991 Lory et al.
5,028,565 A 7/1991 Chang
5,030,319 A 7/1991 Nishino et al.
5,038,713 A 8/1991 Kawakami et al.
5,045,244 A 9/1991 Marlett
5,061,838 A 10/1991 Lane et al.
5,069,938 A 12/1991 Lorimer et al.
5,083,030 A 1/1992 Stavov
5,089,441 A 2/1992 Moslehi
5,089,442 A 2/1992 Olmer
5,147,692 A 9/1992 Bengston
5,156,881 A 10/1992 Okano et al.
5,180,435 A 1/1993 Markunas et al.
5,186,718 A 2/1993 Tepman et al.
5,188,706 A 2/1993 Hori et al.
5,198,034 A 3/1993 deBoer et al.
5,200,016 A 4/1993 Namose
5,203,911 A 4/1993 Sricharoenchalkit et al.
5,215,787 A 6/1993 Homma
5,221,427 A 6/1993 Koinuma et al.
5,228,501 A 7/1993 Tepman et al.
5,231,690 A 7/1993 Soma et al.
5,235,139 A 8/1993 Bengston et al.
5,238,499 A 8/1993 van de Ven et al.
5,240,497 A 8/1993 Shacham et al.
5,248,371 A 9/1993 Maher et al.
5,248,527 A 9/1993 Uchida et al.
5,252,178 A 10/1993 Moslehi
5,266,157 A 11/1993 Kadomura
5,269,881 A 12/1993 Sekiya
5,270,125 A 12/1993 America et al.
5,271,972 A 12/1993 Kwok et al.
5,275,977 A 1/1994 Otsubo et al.
5,277,750 A 1/1994 Wolgang
5,279,669 A 1/1994 Lee
5,279,865 A 1/1994 Chebi et al.
5,288,518 A 2/1994 Homma
5,290,382 A 3/1994 Zarowin et al.
5,290,383 A 3/1994 Koshimizu
5,292,370 A 3/1994 Tsai et al.
5,292,682 A 3/1994 Stevens et al.
5,300,463 A 4/1994 Cathey et al.
5,302,233 A 4/1994 Kim et al.
5,304,250 A 4/1994 Sameshima et al.
5,306,530 A 4/1994 Strongin et al.
5,314,724 A 5/1994 Tsukune et al.
5,319,247 A 6/1994 Matsuura
5,326,427 A 7/1994 Jerbic
5,328,558 A 7/1994 Kawamura et al.
5,328,810 A 7/1994 Lowrey et al.
5,330,578 A 7/1994 Sakama
5,334,552 A 8/1994 Homma
5,345,999 A 9/1994 Hosokawa
5,352,636 A 10/1994 Beinglass
5,356,478 A 10/1994 Chen et al.
5,362,526 A 11/1994 Wang et al.
5,366,585 A 11/1994 Robertson et al.
5,368,897 A 11/1994 Kurihara et al.
5,378,316 A 1/1995 Franke et al.
5,380,560 A 1/1995 Kaja et al.
5,382,311 A 1/1995 Ishikawa et al.
5,384,284 A 1/1995 Doan et al.
5,385,763 A 1/1995 Okano et al.
5,399,237 A 3/1995 Keswick et al.
5,399,529 A 3/1995 Homma
5,403,434 A 4/1995 Moslehi
5,413,670 A 5/1995 Langan et al.
5,413,967 A 5/1995 Matsuda et al.
5,415,890 A 5/1995 Kloiber et al.
5,416,048 A 5/1995 Blalock et al.
5,420,075 A 5/1995 Homma et al.
5,429,995 A 7/1995 Nishiyama et al.
5,439,553 A 8/1995 Grant et al.
5,451,259 A 9/1995 Krogh
5,464,499 A 11/1995 Moslehi
5,468,342 A 11/1995 Nulty et al.
5,474,589 A 12/1995 Ohga et al.
5,478,403 A 12/1995 Shinigawa et al.
5,478,462 A 12/1995 Walsh
5,483,920 A 1/1996 Pryor
5,494,494 A 2/1996 Mizuno et al.
5,500,249 A 3/1996 Telford et al.
5,505,816 A 4/1996 Barnes et al.
5,510,216 A 4/1996 Calabrese et al.
5,516,367 A 5/1996 Lei et al.
5,518,962 A 5/1996 Murao
5,531,835 A 7/1996 Fodor et al.
5,534,070 A 7/1996 Okamura et al.
5,536,360 A 7/1996 Nguyen et al.
5,549,780 A 8/1996 Koinuma et al.
5,558,717 A 9/1996 Zhao et al.
5,560,779 A 10/1996 Knowles et al.
5,563,105 A 10/1996 Dobuzinsky et al.
5,567,243 A 10/1996 Foster et al.
5,571,576 A 11/1996 Qian et al.
5,575,853 A 11/1996 Arami et al.
5,578,130 A 11/1996 Hayashi et al.
5,578,161 A 11/1996 Auda
5,580,421 A 12/1996 Hiatt et al.
5,591,269 A 1/1997 Arami et al.

(56) References Cited

U.S. PATENT DOCUMENTS 5,592,358 A 1/1997 Shamouilian
5,597,439 A 1/1997 Salzman
5,599,740 A 2/1997 Jang et al.
5,614,055 A 3/1997 Fairbairn et al.
5,616,518 A 4/1997 Foo et al.
5,624,582 A 4/1997 Cain
5,626,922 A 5/1997 Miyanaga et al.
5,628,829 A 5/1997 Foster et al.
5,635,086 A 6/1997 Warren, Jr.
5,645,645 A 7/1997 Zhang et al.
5,648,125 A 7/1997 Cane
5,648,175 A 7/1997 Russell et al.
5,656,093 A 8/1997 Burkhart et al.
5,660,957 A 8/1997 Chou et al.
5,661,093 A 8/1997 Ravi et al.
5,670,066 A 9/1997 Barnes et al.
5,674,787 A 10/1997 Zhao et al.
5,676,758 A 10/1997 Hasgawa et al.
5,679,606 A 10/1997 Wang et al.
5,685,946 A 11/1997 Fathauer et al.
5,688,331 A 11/1997 Aruga et al.
5,695,810 A 12/1997 Dubin et al.
5,712,185 A 1/1998 Tsai et al.
5,716,500 A 2/1998 Bardos et al.
5,716,506 A 2/1998 Maclay et al.
5,719,085 A 2/1998 Moon et al.
5,733,816 A 3/1998 Iyer et al.
5,747,373 A 5/1998 Yu
5,753,886 A 5/1998 Iwamura et al.
5,755,859 A 5/1998 Brusic et al.
5,756,400 A 5/1998 Ye et al.
5,756,402 A 5/1998 Jimbo et al.
5,772,770 A 6/1998 Suda et al.
5,781,693 A 7/1998 Ballance et al.
5,786,276 A 7/1998 Brooks et al.
5,788,825 A 8/1998 Park et al.
5,789,300 A 8/1998 Fulford
5,792,376 A 8/1998 Kanai et al.
5,800,686 A 9/1998 Littau et al.
5,804,259 A 9/1998 Robles
5,812,403 A 9/1998 Fong et al.
5,814,238 A 9/1998 Ashby et al.
5,814,365 A 9/1998 Mahawill
5,820,723 A 10/1998 Benjamin et al.
5,824,599 A 10/1998 Schacham-Diamand et al.
5,830,805 A 11/1998 Schacham-Diamand et al.
5,835,334 A 11/1998 McMillin et al.
5,843,538 A 12/1998 Ehrsam et al.
5,843,847 A 12/1998 Pu et al.
5,844,195 A 12/1998 Fairbairn et al.
5,846,332 A 12/1998 Zhao et al.
5,846,373 A 12/1998 Pirkle et al.
5,846,375 A 12/1998 Gilchrist et al.
5,846,598 A 12/1998 Semkow et al.
5,849,639 A 12/1998 Molloy et al.
5,850,105 A 12/1998 Dawson et al.
5,855,681 A 1/1999 Maydan et al.
5,855,685 A 1/1999 Tobe et al.
5,856,240 A 1/1999 Sinha et al.
5,858,876 A 1/1999 Chew
5,863,376 A 1/1999 Wicker
5,865,896 A 2/1999 Nowak
5,866,483 A 2/1999 Shiau et al.
5,868,897 A 2/1999 Ohkawa
5,872,052 A 2/1999 Iyer
5,872,058 A 2/1999 Van Cleemput et al.
5,882,424 A 3/1999 Taylor et al.
5,882,786 A 3/1999 Nassau et al.
5,883,012 A 3/1999 Chiou
5,885,404 A 3/1999 Kim et al.
5,885,749 A 3/1999 Huggins et al.
5,888,906 A 3/1999 Sandhu et al.
5,891,349 A 4/1999 Tobe et al.
5,891,513 A 4/1999 Dubin et al.
5,897,751 A 4/1999 Makowiecki
5,899,752 A 5/1999 Hey et al.
5,900,163 A 5/1999 Yi et al.
5,904,827 A 5/1999 Reynolds
5,907,790 A 5/1999 Kellam
5,910,340 A 6/1999 Uchida et al.
5,913,147 A 6/1999 Dubin et al.
5,913,978 A 6/1999 Kato et al.
5,915,190 A 6/1999 Pirkle
5,918,116 A 6/1999 Chittipeddi
5,919,332 A 7/1999 Koshiishi et al.
5,920,792 A 7/1999 Lin
5,926,737 A 7/1999 Ameen et al.
5,932,077 A 8/1999 Reynolds
5,933,757 A 8/1999 Yoshikawa et al.
5,935,334 A 8/1999 Fong et al.
5,935,340 A 8/1999 Xia et al.
5,937,323 A 8/1999 Orczyk et al.
5,939,831 A 8/1999 Fong et al.
5,942,075 A 8/1999 Nagahata et al.
5,944,049 A 8/1999 Beyer et al.
5,944,902 A 8/1999 Redeker et al.
5,948,702 A 9/1999 Rotondaro
5,951,601 A 9/1999 Lesinski et al.
5,951,776 A 9/1999 Selyutin et al.
5,951,896 A 9/1999 Mahawill
5,953,591 A 9/1999 Ishihara et al.
5,953,635 A 9/1999 Andideh
5,963,840 A 10/1999 Xia et al.
5,968,587 A 10/1999 Frankel et al.
5,968,610 A 10/1999 Liu et al.
5,969,422 A 10/1999 Ting et al.
5,976,327 A 11/1999 Tanaka
5,990,000 A 11/1999 Hong et al.
5,990,013 A 11/1999 Berenguer et al.
5,993,916 A 11/1999 Zhao et al.
5,994,209 A 11/1999 Yieh et al.
5,997,649 A 12/1999 Hillman
5,997,962 A 12/1999 Ogasawara et al.
6,004,884 A 12/1999 Abraham
6,007,635 A 12/1999 Mahawill
6,007,785 A 12/1999 Liou
6,010,962 A 1/2000 Liu et al.
6,013,191 A 1/2000 Nasser-Faili et al.
6,013,584 A 1/2000 M'Saad
6,015,724 A 1/2000 Yamazaki et al.
6,015,747 A 1/2000 Lopatin et al.
6,017,414 A 1/2000 Koemtzopoulos et al.
6,019,848 A 2/2000 Kiyama et al.
6,020,271 A 2/2000 Yanagida
6,030,666 A 2/2000 Lam et al.
6,030,881 A 2/2000 Papasouliotis et al.
6,035,101 A 3/2000 Sajoto et al.
6,036,878 A 3/2000 Collins et al.
6,037,018 A 3/2000 Jang et al.
6,037,266 A 3/2000 Tao et al.
6,039,834 A 3/2000 Tanaka et al.
6,039,851 A 3/2000 Iyer
6,053,982 A 4/2000 Halpin et al.
6,059,643 A 5/2000 Hu et al.
6,063,683 A 5/2000 Wu et al.
6,063,712 A 5/2000 Gilton et al.
6,065,424 A 5/2000 Shacham-Diamand et al.
6,065,425 A 5/2000 Takaki et al.
6,072,147 A 6/2000 Koshiishi
6,072,227 A 6/2000 Yau et al.
6,074,512 A 6/2000 Collins et al.
6,074,514 A 6/2000 Bjorkman et al.
6,077,384 A 6/2000 Collins et al.
6,077,780 A 6/2000 Dubin
6,079,356 A 6/2000 Umotoy et al.
6,080,529 A 6/2000 Ye et al.
6,081,414 A 6/2000 Flanigan et al.
6,083,344 A 7/2000 Hanawa et al.
6,083,844 A 7/2000 Bui-Le et al.
6,086,677 A 7/2000 Umotoy et al.
6,087,278 A 7/2000 Kim et al.
6,090,212 A 7/2000 Mahawill
6,093,457 A 7/2000 Okumura
6,093,594 A 7/2000 Yeap et al.

(56) References Cited

U.S. PATENT DOCUMENTS 6,099,697 A 8/2000 Hausmann
6,107,199 A 8/2000 Allen et al.
6,110,530 A 8/2000 Chen et al.
6,110,832 A 8/2000 Morgan et al.
6,110,836 A 8/2000 Cohen et al.
6,110,838 A 8/2000 Loewenstein
6,113,771 A 9/2000 Landau et al.
6,114,216 A 9/2000 Yieh et al.
6,117,245 A 9/2000 Mandrekar et al.
6,120,640 A 9/2000 Shih et al.
6,136,163 A 10/2000 Cheung et al.
6,136,165 A 10/2000 Moslehi et al.
6,136,685 A 10/2000 Narwankar et al.
6,136,693 A 10/2000 Chan et al.
6,140,234 A 10/2000 Uzoh et al.
6,144,099 A 11/2000 Lopatin et al.
6,147,009 A 11/2000 Grill et al.
6,148,761 A 11/2000 Majewski et al.
6,149,828 A 11/2000 Vaartstra
6,150,628 A 11/2000 Smith et al.
6,153,935 A 11/2000 Edelstein et al.
6,161,500 A 12/2000 Kopacz et al.
6,161,576 A 12/2000 Maher et al.
6,162,302 A 12/2000 Raghavan et al.
6,162,370 A 12/2000 Hackett et al.
6,165,912 A 12/2000 McConnell et al.
6,167,834 B1 1/2001 Wang et al.
6,169,021 B1 1/2001 Akram et al.
6,170,428 B1 1/2001 Redeker et al.
6,171,661 B1 1/2001 Zheng et al.
6,174,450 B1 1/2001 Patrick et al.
6,174,810 B1 1/2001 Patrick et al.
6,174,812 B1 1/2001 Hsuing et al.
6,176,198 B1 1/2001 Kao et al.
6,176,667 B1 1/2001 Fairbairn
6,177,245 B1 1/2001 Ward et al.
6,179,924 B1 1/2001 Zhao et al.
6,180,523 B1 1/2001 Lee et al.
6,182,602 B1 2/2001 Redeker et al.
6,182,603 B1 2/2001 Shang et al.
6,184,121 B1 2/2001 Buchwalter et al.
6,186,091 B1 2/2001 Chu et al.
6,189,483 B1 2/2001 Ishikawa et al.
6,190,233 B1 2/2001 Hong et al.
6,194,038 B1 2/2001 Rossman
6,197,181 B1 3/2001 Chen
6,197,364 B1 3/2001 Paunovic et al.
6,197,680 B1 3/2001 Lin et al.
6,197,688 B1 3/2001 Simpson
6,197,705 B1 3/2001 Vassiliev
6,198,616 B1 3/2001 Dahimene et al.
6,203,863 B1 3/2001 Liu et al.
6,204,200 B1 3/2001 Shieh et al.
6,210,486 B1 4/2001 Mizukami et al.
6,217,658 B1 4/2001 Orczyk et al.
6,220,201 B1 4/2001 Nowak
6,225,745 B1 5/2001 Srivastava
6,228,233 B1 5/2001 Lakshmikanthan et al.
6,228,751 B1 5/2001 Yamazaki et al.
6,228,758 B1 5/2001 Pellerin et al.
6,235,643 B1 5/2001 Mui et al.
6,237,527 B1 5/2001 Kellerman et al.
6,238,513 B1 5/2001 Arnold et al.
6,238,582 B1 5/2001 Williams et al.
6,197,151 B1 6/2001 Kaji et al.
6,241,845 B1 6/2001 Gadgil et al.
6,242,349 B1 6/2001 Nogami et al.
6,244,211 B1 6/2001 Nishikawa et al.
6,245,396 B1 6/2001 Nogami
6,245,670 B1 6/2001 Cheung et al.
6,251,236 B1 6/2001 Stevens
6,251,802 B1 6/2001 Moore et al.
6,258,170 B1 7/2001 Somekh et al.
6,258,220 B1 7/2001 Dordi et al.
6,258,223 B1 7/2001 Cheung et al.
6,258,270 B1 7/2001 Hilgendorff et al.
6,261,637 B1 7/2001 Oberle
6,277,733 B1 8/2001 Smith
6,277,752 B1 8/2001 Chen
6,277,763 B1 8/2001 Kugimiya et al.
6,281,072 B1 8/2001 Li et al.
6,281,135 B1 8/2001 Han et al.
6,284,146 B1 9/2001 Kim et al.
6,291,282 B1 9/2001 Wilk et al.
6,291,348 B1 9/2001 Lopatin et al.
6,303,044 B1 10/2001 Koemtzopoulos
6,303,418 B1 10/2001 Cha et al.
6,306,772 B1 10/2001 Lin
6,308,654 B1 10/2001 Schneider et al.
6,308,776 B1 10/2001 Sloan
6,310,755 B1 10/2001 Busato et al.
6,312,554 B1 11/2001 Ye
6,312,995 B1 11/2001 Yu
6,319,387 B1 11/2001 Krishnamoorthy et al.
6,321,587 B1 11/2001 Laush
6,322,716 B1 11/2001 Qiao et al.
6,323,128 B1 11/2001 Sambucetti et al.
6,335,288 B1 1/2002 Kwan et al.
6,340,435 B1 1/2002 Bjorkman et al.
6,342,733 B1 1/2002 Hu et al.
RE37,546 E 2/2002 Mahawili
6,344,410 B1 2/2002 Lopatin et al.
6,348,407 B1 2/2002 Gupta et al.
6,350,320 B1 2/2002 Sherstinsky et al.
6,350,697 B1 2/2002 Richardson
6,351,013 B1 2/2002 Luning et al.
6,352,081 B1 3/2002 Lu et al.
6,355,573 B1 3/2002 Okumura
6,364,949 B1 4/2002 Or et al.
6,364,954 B2 4/2002 Umotoy et al.
6,364,957 B1 4/2002 Schneider et al.
6,375,748 B1 4/2002 Yudovsky et al.
6,376,386 B1 4/2002 Oshima
6,379,575 B1 4/2002 Yin et al.
6,383,896 B1 5/2002 Kirimura et al.
6,383,951 B1 5/2002 Li
6,387,207 B1 5/2002 Janakiraman et al.
6,391,753 B1 5/2002 Yu
6,395,150 B1 5/2002 Van Cleemput et al.
6,403,491 B1 6/2002 Liu et al.
6,415,736 B1 7/2002 Hao et al.
6,416,647 B1 7/2002 Dordi et al.
6,418,874 B1 7/2002 Cox et al.
6,423,284 B1 7/2002 Arno
6,427,623 B2 8/2002 Ko
6,429,465 B1 8/2002 Yagi et al.
6,432,819 B1 8/2002 Pavate et al.
6,432,831 B2 8/2002 Dhindsa et al.
6,436,193 B1 8/2002 Kasai et al.
6,436,816 B1 8/2002 Lee et al.
6,440,863 B1 8/2002 Tsai et al.
6,441,492 B1 8/2002 Cunningham
6,446,572 B1 9/2002 Brcka
6,448,537 B1 9/2002 Nering
6,458,718 B1 10/2002 Todd
6,461,974 B1 10/2002 Ni et al.
6,462,371 B1 10/2002 Weimer et al.
6,462,372 B1 10/2002 Xia et al.
6,465,051 B1 10/2002 Sahin et al.
6,465,350 B1 10/2002 Taylor et al.
6,465,366 B1 10/2002 Nemani et al.
6,477,980 B1 11/2002 White et al.
6,479,373 B2 11/2002 Dreybrodt et al.
6,488,984 B1 12/2002 Wada et al.
6,494,959 B1 12/2002 Samoilov et al.
6,499,425 B1 12/2002 Sandhu et al.
6,500,728 B1 12/2002 Wang
6,503,843 B1 1/2003 Xia et al.
6,506,291 B2 1/2003 Tsai et al.
6,509,283 B1 1/2003 Thomas
6,509,623 B2 1/2003 Zhao
6,516,815 B1 2/2003 Stevens et al.
6,518,548 B2 2/2003 Sugaya et al.
6,527,968 B1 3/2003 Wang et al.

(56) References Cited

U.S. PATENT DOCUMENTS 6,528,409 B1 3/2003 Lopatin et al.
6,528,751 B1 3/2003 Hoffman et al.
6,537,707 B1 3/2003 Lee
6,537,733 B2 3/2003 Campana et al.
6,541,397 B1 4/2003 Bencher
6,541,671 B1 4/2003 Martinez et al.
6,544,340 B2 4/2003 Yudovsky
6,547,977 B1 4/2003 Yan et al.
6,551,924 B1 4/2003 Dalton et al.
6,558,564 B1 5/2003 Loewenhardt
6,565,661 B1 5/2003 Nguyen
6,565,729 B2 5/2003 Chen et al.
6,569,773 B1 5/2003 Gellrich et al.
6,572,937 B2 6/2003 Hakovirta et al.
6,573,030 B1 6/2003 Fairbairn et al.
6,573,606 B2 6/2003 Sambucetti et al.
6,585,851 B1 7/2003 Ohmi et al.
6,586,163 B1 7/2003 Okabe et al.
6,596,599 B1 7/2003 Guo
6,596,654 B1 7/2003 Bayman et al.
6,602,434 B1 8/2003 Hung et al.
6,602,806 B1 8/2003 Xia et al.
6,603,269 B1 8/2003 Vo et al.
6,605,874 B2 8/2003 Leu et al.
6,616,967 B1 9/2003 Test
6,627,532 B1 9/2003 Gaillard et al.
6,635,575 B1 10/2003 Xia et al.
6,635,578 B1 10/2003 Xu et al.
6,638,810 B2 10/2003 Bakli et al.
6,645,301 B2 11/2003 Sainty et al.
6,645,550 B1 11/2003 Cheung et al.
6,656,831 B1 12/2003 Lee et al.
6,656,837 B2 12/2003 Xu et al.
6,656,848 B1 12/2003 Scanlan et al.
6,663,715 B1 12/2003 Yuda et al.
6,677,242 B1 1/2004 Liu et al.
6,679,981 B1 1/2004 Pan et al.
6,688,375 B1 2/2004 Turner
6,713,356 B1 3/2004 Skotnicki et al.
6,713,835 B1 3/2004 Horak et al.
6,717,189 B2 4/2004 Inoue et al.
6,720,213 B1 4/2004 Gambino et al.
6,736,147 B2 5/2004 Satoh et al.
6,736,987 B1 5/2004 Cho
6,740,247 B1 5/2004 Han et al.
6,740,585 B2 5/2004 Yoon et al.
6,740,977 B2 5/2004 Ahn et al.
6,743,473 B1 6/2004 Parkhe et al.
6,743,732 B1 6/2004 Lin et al.
6,756,235 B1 6/2004 Liu et al.
6,759,261 B2 7/2004 Shimokohbe et al.
6,762,127 B2 7/2004 Boiteux et al.
6,762,435 B2 7/2004 Towle
6,764,958 B1 7/2004 Nemani et al.
6,765,273 B1 7/2004 Chau et al.
6,767,834 B2 7/2004 Chung et al.
6,768,079 B2 7/2004 Kosakai
6,770,166 B1 8/2004 Fisher
6,772,827 B2 8/2004 Keller et al.
6,792,889 B2 9/2004 Nakano et al.
6,794,290 B1 9/2004 Papasouliotis et al.
6,794,311 B2 9/2004 Huang et al.
6,796,314 B1 9/2004 Graff et al.
6,797,189 B2 9/2004 Hung et al.
6,800,336 B1 10/2004 Fornsel et al.
6,800,830 B2 10/2004 Mahawili
6,802,944 B2 10/2004 Ahmad et al.
6,808,564 B2 10/2004 Dietze
6,808,747 B1 10/2004 Shih et al.
6,808,748 B2 10/2004 Kapoor et al.
6,815,633 B1 11/2004 Chen et al.
6,821,571 B2 11/2004 Huang
6,823,589 B2 11/2004 White et al.
6,828,241 B2 12/2004 Kholodenko et al.
6,830,624 B2 12/2004 Janakiraman et al.
6,835,995 B2 12/2004 Li
6,846,745 B1 1/2005 Papasouliotis et al.
6,849,854 B2 2/2005 Sainty
6,852,550 B2 2/2005 Tuttle et al.
6,852,584 B1 2/2005 Chen et al.
6,853,533 B2 2/2005 Parkhe et al.
6,858,153 B2 2/2005 Bjorkman et al.
6,861,097 B1 3/2005 Goosey et al.
6,861,332 B2 3/2005 Park et al.
6,869,880 B2 3/2005 Krishnaraj et al.
6,875,280 B2 4/2005 Ikeda et al.
6,878,206 B2 4/2005 Tzu et al.
6,879,981 B2 4/2005 Rothschild et al.
6,886,491 B2 5/2005 Kim et al.
6,892,669 B2 5/2005 Xu et al.
6,893,967 B1 5/2005 Wright et al.
6,897,532 B1 5/2005 Schwarz et al.
6,900,596 B2 5/2005 Yang et al.
6,903,511 B2 6/2005 Chistyakov
6,908,862 B2 6/2005 Li et al.
6,911,112 B2 6/2005 An
6,911,401 B2 6/2005 Khandan et al.
6,916,399 B1 7/2005 Rozenzon et al.
6,921,556 B2 7/2005 Shimizu et al.
6,924,191 B2 8/2005 Liu et al.
6,930,047 B2 8/2005 Yamazaki
6,935,269 B2 8/2005 Lee et al.
6,942,753 B2 9/2005 Choi et al.
6,946,033 B2 9/2005 Tsuel et al.
6,951,821 B2 10/2005 Hamelin et al.
6,958,175 B2 10/2005 Sakamoto et al.
6,958,286 B2 10/2005 Chen et al.
6,969,619 B1 11/2005 Winniczek
6,995,073 B2 2/2006 Liou
7,017,269 B2 3/2006 White et al.
7,018,941 B2 3/2006 Cui et al.
7,030,034 B2 4/2006 Fucsko et al.
7,049,200 B2 5/2006 Arghavani et al.
7,052,553 B1 5/2006 Shih et al.
7,071,532 B2 7/2006 Geffken et al.
7,084,070 B1 8/2006 Lee et al.
7,115,525 B2 10/2006 Abatchev et al.
7,122,949 B2 10/2006 Strikovski
7,138,767 B2 11/2006 Chen et al.
7,145,725 B2 12/2006 Hasel et al.
7,148,155 B1 12/2006 Tarafdar et al.
7,166,233 B2 1/2007 Johnson et al.
7,183,214 B2 2/2007 Nam et al.
7,196,342 B2 3/2007 Ershov et al.
7,226,805 B2 6/2007 Hallin et al.
7,235,137 B2 6/2007 Kitayama et al.
7,244,474 B2 7/2007 Hanawa et al.
7,252,011 B2 8/2007 Traverso
7,252,716 B2 8/2007 Kim et al.
7,253,123 B2 8/2007 Arghavani et al.
7,256,370 B2 8/2007 Guiver
7,274,004 B2 9/2007 Benjamin et al.
7,288,482 B2 10/2007 Panda et al.
7,291,360 B2 11/2007 Hanawa et al.
7,316,761 B2 1/2008 Doan et al.
7,329,608 B2 2/2008 Babayan et al.
7,341,633 B2 3/2008 Lubomirsky et al.
7,344,912 B1 3/2008 Okoroanyanwu
7,358,192 B2 4/2008 Merry et al.
7,361,865 B2 4/2008 Maki et al.
7,364,956 B2 4/2008 Saito
7,365,016 B2 4/2008 Ouellet et al.
7,396,480 B2 7/2008 Kao et al.
7,396,773 B1 7/2008 Blosse et al.
7,416,989 B1 8/2008 Liu et al.
7,465,358 B2 12/2008 Weidman et al.
7,465,953 B1 12/2008 Koh et al.
7,468,319 B2 12/2008 Lee
7,479,303 B2 1/2009 Byun et al.
7,484,473 B2 2/2009 Keller et al.
7,488,688 B2 2/2009 Chung et al.
7,494,545 B2 2/2009 Lam et al.
7,500,445 B2 3/2009 Zhao et al.
7,513,214 B2 4/2009 Okumura et al.

(56) References Cited

U.S. PATENT DOCUMENTS 7,520,957 B2 4/2009 Kao et al.
7,553,756 B2 6/2009 Hayashi et al.
7,575,007 B2 8/2009 Tang et al.
7,581,511 B2 9/2009 Mardian et al.
7,604,708 B2 10/2009 Wood et al.
7,611,980 B2 11/2009 Wells
7,628,897 B2 12/2009 Mungekar et al.
7,658,799 B2 2/2010 Ishikawa et al.
7,682,518 B2 3/2010 Chandrachood et al.
7,695,590 B2 4/2010 Hanawa et al.
7,708,859 B2 5/2010 Huang et al.
7,722,925 B2 5/2010 White et al.
7,723,221 B2 5/2010 Hayashi
7,749,326 B2 7/2010 Kim et al.
7,780,790 B2 8/2010 Nogami
7,785,672 B2 8/2010 Choi et al.
7,790,634 B2 9/2010 Munro et al.
7,806,077 B2 10/2010 Lee et al.
7,806,078 B2 10/2010 Yoshida
7,807,578 B2 10/2010 Bencher et al.
7,825,038 B2 11/2010 Ingle et al.
7,837,828 B2 11/2010 Ikeda et al.
7,845,309 B2 12/2010 Condrashoff et al.
7,867,926 B2 1/2011 Satoh et al.
7,915,139 B1 3/2011 Lang et al.
7,922,863 B2 4/2011 Ripley
7,932,181 B2 4/2011 Singh et al.
7,939,422 B2 5/2011 Ingle et al.
7,968,441 B2 6/2011 Xu
7,976,631 B2 7/2011 Burrows
7,977,249 B1 7/2011 Liu
7,981,806 B2 7/2011 Jung
7,989,365 B2 8/2011 Park et al.
8,008,166 B2 8/2011 Sanchez et al.
8,048,811 B2 11/2011 Feustel et al.
8,058,179 B1 11/2011 Draeger et al.
8,071,482 B2 12/2011 Kawada
8,074,599 B2 12/2011 Choi et al.
8,076,198 B2 12/2011 Lee et al.
8,083,853 B2 12/2011 Choi et al.
8,114,245 B2 2/2012 Ohmi et al.
8,119,530 B2 2/2012 Hori et al.
8,133,349 B1 3/2012 Panagopoulos
8,173,228 B2 5/2012 Choi et al.
8,183,134 B2 5/2012 Wu
8,187,486 B1 5/2012 Liu et al.
8,211,808 B2 7/2012 Sapre et al.
8,216,486 B2 7/2012 Dhindsa
8,222,128 B2 7/2012 Sasaki et al.
8,252,194 B2 8/2012 Kiehlbauch et al.
8,272,346 B2 9/2012 Bettencourt et al.
8,295,089 B2 10/2012 Jeong et al.
8,298,627 B2 10/2012 Minami et al.
8,298,959 B2 10/2012 Cheshire
8,309,440 B2 11/2012 Sanchez et al.
8,312,839 B2 11/2012 Baek
8,313,610 B2 11/2012 Dhindsa
8,328,939 B2 12/2012 Choi et al.
8,329,262 B2 12/2012 Miller et al.
8,336,188 B2 12/2012 Monteen
8,357,435 B2 1/2013 Lubomirsky
8,361,892 B2 1/2013 Tam et al.
8,368,308 B2 2/2013 Banna et al.
8,390,980 B2 3/2013 Sansoni et al.
8,427,067 B2 4/2013 Espiau et al.
8,435,902 B2 5/2013 Tang et al.
8,440,523 B1 5/2013 Guillorn et al.
8,466,073 B2 6/2013 Wang et al.
8,475,674 B2 7/2013 Thadani et al.
8,480,850 B2 7/2013 Tyler et al.
8,491,805 B2 7/2013 Kushibiki et al.
8,501,629 B2 8/2013 Tang et al.
8,506,713 B2 8/2013 Takagi
8,512,509 B2 8/2013 Bera et al.
8,528,889 B2 9/2013 Sansoni et al.
8,540,844 B2 9/2013 Hudson et al.
8,551,891 B2 10/2013 Liang
8,573,152 B2 11/2013 De La Llera
8,622,021 B2 1/2014 Taylor et al.
8,623,471 B2 1/2014 Tyler et al.
8,633,423 B2 1/2014 Lin et al.
8,642,481 B2 2/2014 Wang et al.
8,652,298 B2 2/2014 Dhindsa et al.
8,668,836 B2 3/2014 Mizukami et al.
8,679,982 B2 3/2014 Wang et al.
8,679,983 B2 3/2014 Wang et al.
8,691,023 B2 4/2014 Bao et al.
8,702,902 B2 4/2014 Blom et al.
8,741,778 B2 6/2014 Yang et al.
8,747,680 B1 6/2014 Deshpande
8,748,322 B1 6/2014 Fung et al.
8,765,574 B2 7/2014 Zhang et al.
8,771,536 B2 7/2014 Zhang et al.
8,771,539 B2 7/2014 Zhang et al.
8,772,888 B2 7/2014 Jung et al.
8,778,079 B2 7/2014 Begarney et al.
8,801,952 B1 8/2014 Wang et al.
8,802,572 B2 8/2014 Nemani et al.
8,808,563 B2 8/2014 Wang et al.
8,815,720 B2 8/2014 Godet et al.
8,846,163 B2 9/2014 Kao et al.
8,869,742 B2 10/2014 Dhindsa
8,871,651 B1 10/2014 Choi et al.
8,888,087 B2 11/2014 Okabe et al.
8,894,767 B2 11/2014 Goradia et al.
8,895,449 B1 11/2014 Zhu et al.
8,900,364 B2 12/2014 Wright
8,921,234 B2 12/2014 Liu et al.
8,927,390 B2 1/2015 Sapre et al.
8,932,947 B1 1/2015 Han et al.
8,937,017 B2 1/2015 Cheshire et al.
8,951,429 B1 2/2015 Liu et al.
8,956,980 B1 2/2015 Chen et al.
8,969,212 B2 3/2015 Ren et al.
8,970,114 B2 3/2015 Busche et al.
8,980,005 B2 3/2015 Carlson et al.
8,980,758 B1 3/2015 Ling et al.
8,980,763 B2 3/2015 Wang et al.
8,992,723 B2 3/2015 Sorensen et al.
8,999,656 B2 4/2015 Jirstrom et al.
8,999,839 B2 4/2015 Su et al.
8,999,856 B2 4/2015 Zhang et al.
9,012,302 B2 4/2015 Sapre et al.
9,017,481 B1 4/2015 Pettinger et al.
9,023,732 B2 5/2015 Wang et al.
9,023,734 B2 5/2015 Chen et al.
9,034,770 B2 5/2015 Park et al.
9,040,422 B2 5/2015 Wang et al.
9,064,815 B2 6/2015 Zhang et al.
9,064,816 B2 6/2015 Kim et al.
9,072,158 B2 6/2015 Ikeda et al.
9,093,371 B2 7/2015 Wang et al.
9,093,389 B2 7/2015 Nemani
9,093,390 B2 7/2015 Wang et al.
9,111,877 B2 8/2015 Chen et al.
9,111,907 B2 8/2015 Kamineni
9,114,438 B2 8/2015 Hoinkis et al.
9,117,855 B2 8/2015 Cho et al.
9,132,436 B2 9/2015 Liang et al.
9,136,273 B1 9/2015 Purayath et al.
9,144,147 B2 9/2015 Yang et al.
9,153,442 B2 10/2015 Wang et al.
9,159,606 B1 10/2015 Purayath et al.
9,165,783 B2 10/2015 Nemani et al.
9,165,786 B1 10/2015 Purayath et al.
9,184,055 B2 11/2015 Wang et al.
9,190,290 B2 11/2015 Xue et al.
9,190,293 B2 11/2015 Wang et al.
9,190,302 B2 11/2015 Ni
9,202,708 B1 12/2015 Chen et al.
9,209,012 B2 12/2015 Chen et al.
9,236,265 B2 1/2016 Korolik et al.
9,236,266 B2 1/2016 Zhang et al.
9,240,315 B1 1/2016 Hsieh et al.

(56) References Cited

U.S. PATENT DOCUMENTS 9,245,762 B2 1/2016 Zhang et al.
9,263,278 B2 2/2016 Purayath et al.
9,269,590 B2 2/2016 Luere et al.
9,275,834 B1 3/2016 Park et al.
9,287,095 B2 3/2016 Nguyen et al.
9,287,134 B2 3/2016 Wang et al.
9,293,568 B2 3/2016 Ko
9,299,537 B2 3/2016 Kobayashi et al.
9,299,538 B2 3/2016 Kobayashi et al.
9,299,575 B2 3/2016 Park et al.
9,299,582 B2 3/2016 Ingle et al.
9,299,583 B1 3/2016 Wang et al.
9,309,598 B2 4/2016 Wang et al.
9,324,576 B2 4/2016 Zhang et al.
9,343,272 B1 5/2016 Pandit et al.
9,343,327 B2 5/2016 Zhange et al.
9,349,605 B1 5/2016 Xu et al.
9,355,856 B2 5/2016 Wang et al.
9,355,862 B2 5/2016 Pandit et al.
9,355,863 B2 5/2016 Chen et al.
9,355,922 B2 5/2016 Park et al.
9,362,130 B2 6/2016 Ingle et al.
9,362,163 B2 6/2016 Danek et al.
9,368,364 B2 6/2016 Park et al.
9,373,517 B2 6/2016 Yang et al.
9,373,522 B1 6/2016 Wang et al.
9,378,969 B2 6/2016 Hsu et al.
9,378,978 B2 6/2016 Purayath et al.
9,384,997 B2 7/2016 Ren et al.
9,385,028 B2 7/2016 Nemani et al.
9,390,937 B2 7/2016 Chen et al.
9,396,961 B2 7/2016 Arghavani et al.
9,396,989 B2 7/2016 Purayath et al.
9,406,523 B2 8/2016 Chen et al.
9,412,608 B2 8/2016 Wang et al.
9,418,858 B2 8/2016 Wang et al.
9,425,041 B2 8/2016 Berry et al.
9,425,058 B2 8/2016 Kim et al.
9,431,268 B2 8/2016 Lill et al.
9,343,358 B1 9/2016 Montgomery
9,437,451 B2 9/2016 Chen et al.
9,443,749 B2 9/2016 Smith
9,449,845 B2 9/2016 Liu et al.
9,449,846 B2 9/2016 Liu et al.
9,449,850 B2 9/2016 Wang et al.
9,460,959 B1 10/2016 Xie et al.
9,466,469 B2 10/2016 Khaja
9,472,412 B2 10/2016 Zhang et al.
9,472,417 B2 10/2016 Ingle et al.
9,478,432 B2 10/2016 Chen et al.
9,478,433 B1 10/2016 Zhou et al.
9,478,434 B2 10/2016 Wang et al.
9,493,879 B2 11/2016 Hoinkis et al.
9,496,167 B2 11/2016 Purayath et al.
9,499,898 B2 11/2016 Nguyen et al.
9,502,258 B2 11/2016 Xue et al.
9,508,529 B2 11/2016 Valcore et al.
9,520,303 B2 12/2016 Wang et al.
9,543,163 B2 1/2017 Ling et al.
9,564,296 B2 2/2017 Kobayashi et al.
9,564,338 B1 2/2017 Zhang et al.
9,576,788 B2 2/2017 Liu et al.
9,576,809 B2 2/2017 Korolik et al.
9,607,856 B2 3/2017 Wang et al.
9,613,822 B2 4/2017 Chen et al.
9,659,753 B2 5/2017 Cho et al.
9,659,791 B2 5/2017 Wang et al.
9,659,792 B2 5/2017 Wang et al.
9,666,449 B2 5/2017 Koval et al.
9,691,645 B2 6/2017 Ayers
9,704,723 B2 7/2017 Wang et al.
9,711,366 B2 7/2017 Ingle et al.
9,721,789 B1 8/2017 Yang et al.
9,728,437 B2 8/2017 Tran et al.
9,741,593 B2 8/2017 Benjaminson et al.
9,754,800 B2 9/2017 Zhang et al.
9,768,034 B1 9/2017 Xu et al.
9,773,648 B2 9/2017 Cho et al.
9,773,695 B2 9/2017 Purayath et al.
9,779,956 B1 10/2017 Zhang et al.
9,822,009 B2 11/2017 Kagaya et al.
9,831,097 B2 11/2017 Ingle et al.
9,837,249 B2 12/2017 Kobayashi et al.
9,837,284 B2 12/2017 Chen et al.
9,837,286 B2 12/2017 Yang et al.
9,842,744 B2 12/2017 Zhang et al.
9,865,484 B1 1/2018 Citla et al.
9,881,805 B2 1/2018 Li et al.
9,885,117 B2 2/2018 Lubomirsky et al.
9,887,096 B2 2/2018 Park et al.
9,903,020 B2 2/2018 Kim et al.
9,934,942 B1 4/2018 Lubomirsky
9,947,549 B1 4/2018 Park et al.
9,966,240 B2 5/2018 Park et al.
9,978,564 B2 5/2018 Liang et al.
9,991,134 B2 6/2018 Wang et al.
10,026,621 B2 7/2018 Ko et al.
10,032,606 B2 7/2018 Yang et al.
10,043,674 B1 8/2018 Korolik et al.
10,043,684 B1 8/2018 Arnepalli et al.
10,049,891 B1 8/2018 Wang et al.
10,062,578 B2 8/2018 Zhang et al.
10,062,579 B2 8/2018 Chen et al.
10,062,585 B2 8/2018 Lubomirsky
10,062,587 B2 8/2018 Chen et al.
2001/0006093 A1 7/2001 Tabuchi
2001/0008803 A1 7/2001 Takamatsu et al.
2001/0015175 A1 8/2001 Masuda et al.
2001/0015261 A1 8/2001 Kobayashi et al.
2001/0028093 A1 10/2001 Yamazaki et al.
2001/0028922 A1 10/2001 Sandhu
2001/0029891 A1 10/2001 Oh et al.
2001/0030366 A1 10/2001 Nakano et al.
2001/0034106 A1 10/2001 Moise et al.
2001/0034121 A1 10/2001 Fu et al.
2001/0035124 A1 11/2001 Okayama et al.
2001/0036706 A1 11/2001 Kitamura
2001/0037856 A1 11/2001 Park
2001/0037941 A1 11/2001 Thompson
2001/0039921 A1 11/2001 Rolfson et al.
2001/0042512 A1 11/2001 Xu et al.
2001/0042799 A1 11/2001 Kim et al.
2001/0047760 A1 12/2001 Moslehi
2001/0053585 A1 12/2001 Kikuchi et al.
2001/0053610 A1 12/2001 Athavale
2001/0054381 A1 12/2001 Umotoy et al.
2001/0054387 A1 12/2001 Frankel et al.
2002/0000202 A1 1/2002 Yuda et al.
2002/0001778 A1 1/2002 Latchford et al.
2002/0009560 A1 1/2002 Ozono
2002/0009885 A1 1/2002 Brankner et al.
2002/0011210 A1 1/2002 Satoh et al.
2002/0011214 A1 1/2002 Kamarehi et al.
2002/0016080 A1 2/2002 Khan et al.
2002/0016085 A1 2/2002 Huang et al.
2002/0023899 A1 2/2002 Khater et al.
2002/0028582 A1 3/2002 Nallan et al.
2002/0028585 A1 3/2002 Chung et al.
2002/0029747 A1 3/2002 Powell et al.
2002/0033233 A1 3/2002 Savas
2002/0036143 A1 3/2002 Segawa et al.
2002/0040764 A1 4/2002 Kwan et al.
2002/0040766 A1 4/2002 Takahashi
2002/0043690 A1 4/2002 Doyle et al.
2002/0045966 A1 4/2002 Lee et al.
2002/0046991 A1 4/2002 Smith et al.
2002/0054962 A1 5/2002 Huang
2002/0062954 A1 5/2002 Getchel et al.
2002/0069820 A1 6/2002 Yudovsky
2002/0070414 A1 6/2002 Drescher et al.
2002/0074573 A1 6/2002 Takeuchi et al.
2002/0086501 A1 7/2002 O'Donnell et al.
2002/0090781 A1 7/2002 Skotnicki et al.
2002/0090835 A1 7/2002 Chakravarti et al.

(56) References Cited

U.S. PATENT DOCUMENTS

2002/0094378 A1 7/2002 O'Donnell
2002/0094591 A1 7/2002 Sill et al.
2002/0096493 A1 7/2002 Hattori
2002/0098681 A1 7/2002 Hu et al.
2002/0106845 A1 8/2002 Chao et al.
2002/0112819 A1 8/2002 Kamarehi et al.
2002/0124867 A1 9/2002 Kim et al.
2002/0129769 A1 9/2002 Kim et al.
2002/0129902 A1 9/2002 Babayan et al.
2002/0144657 A1 10/2002 Chiang et al.
2002/0153808 A1 10/2002 Skotnicki et al.
2002/0164885 A1 11/2002 Lill et al.
2002/0170678 A1 11/2002 Hayashi et al.
2002/0177322 A1 11/2002 Li et al.
2002/0179248 A1 12/2002 Kabansky et al.
2002/0182878 A1 12/2002 Hirose et al.
2002/0187280 A1 12/2002 Johnson et al.
2002/0187655 A1 12/2002 Tan et al.
2002/0197823 A1 12/2002 Yoo et al.
2003/0000647 A1 1/2003 Yudovsky et al.
2003/0003757 A1 1/2003 Naltan et al.
2003/0007910 A1 1/2003 Lazarovich et al.
2003/0010645 A1 1/2003 Ting et al.
2003/0019428 A1 1/2003 Ku et al.
2003/0019580 A1 1/2003 Strang
2003/0026060 A1 2/2003 Hiramatsu et al.
2003/0029566 A1 2/2003 Roth
2003/0029567 A1 2/2003 Dhindsa et al.
2003/0029715 A1 2/2003 Yu et al.
2003/0031905 A1 2/2003 Saito et al.
2003/0032284 A1 2/2003 Enomoto et al.
2003/0038127 A1 2/2003 Liu et al.
2003/0038305 A1 2/2003 Wasshuber
2003/0054608 A1 3/2003 Tseng et al.
2003/0066482 A1 4/2003 Pokharna et al.
2003/0071035 A1 4/2003 Brailove
2003/0072639 A1 4/2003 White et al.
2003/0075808 A1 4/2003 Inoue et al.
2003/0077857 A1 4/2003 Xia et al.
2003/0077909 A1 4/2003 Jiwari
2003/0079686 A1 5/2003 Chen et al.
2003/0087488 A1 5/2003 Fink
2003/0087531 A1 5/2003 Kang et al.
2003/0091938 A1 5/2003 Fairbairn et al.
2003/0094134 A1 5/2003 Minami et al.
2003/0098125 A1 5/2003 An
2003/0109143 A1 6/2003 Hsieh et al.
2003/0116087 A1 6/2003 Nguyen et al.
2003/0116439 A1 6/2003 Seo et al.
2003/0121608 A1 7/2003 Chen et al.
2003/0121609 A1 7/2003 Ohmi et al.
2003/0124465 A1 7/2003 Lee et al.
2003/0124842 A1 7/2003 Hytros et al.
2003/0127049 A1 7/2003 Han et al.
2003/0127740 A1 7/2003 Hsu et al.
2003/0129106 A1 7/2003 Sorensen et al.
2003/0129827 A1 7/2003 Lee et al.
2003/0132319 A1 7/2003 Hytros et al.
2003/0140844 A1 7/2003 Maa et al.
2003/0143328 A1 7/2003 Chen et al.
2003/0148035 A1 8/2003 Lingampalli
2003/0150530 A1 8/2003 Lin et al.
2003/0152691 A1 8/2003 Baude
2003/0159307 A1 8/2003 Sago et al.
2003/0164226 A1 9/2003 Kanno et al.
2003/0168439 A1 9/2003 Kanno et al.
2003/0170945 A1 9/2003 Igeta et al.
2003/0173333 A1 9/2003 Wang et al.
2003/0173347 A1 9/2003 Guiver
2003/0173675 A1 9/2003 Watanabe et al.
2003/0181040 A1 9/2003 Ivanov et al.
2003/0183244 A1 10/2003 Rossman
2003/0190426 A1 10/2003 Padhi et al.
2003/0196760 A1 10/2003 Tyler et al.
2003/0199170 A1 10/2003 Li
2003/0200929 A1 10/2003 Otsuki
2003/0205329 A1 11/2003 Gujer et al.
2003/0205479 A1 11/2003 Lin et al.
2003/0209323 A1 11/2003 Yokogaki et al.
2003/0215570 A1 11/2003 Seutter et al.
2003/0215963 A1 11/2003 AmRhein et al.
2003/0216044 A1 11/2003 Lin et al.
2003/0221780 A1 12/2003 Lei et al.
2003/0224217 A1 12/2003 Byun et al.
2003/0224617 A1 12/2003 Baek et al.
2003/0230385 A1 12/2003 Bach et al.
2004/0003828 A1 1/2004 Jackson
2004/0005726 A1 1/2004 Huang
2004/0018304 A1 1/2004 Chung et al.
2004/0020801 A1 2/2004 Solling
2004/0026371 A1 2/2004 Nguyen et al.
2004/0033678 A1 2/2004 Arghavani et al.
2004/0033684 A1 2/2004 Li
2004/0050328 A1 3/2004 Kumagai et al.
2004/0058070 A1 3/2004 Takeuchi et al.
2004/0058293 A1 3/2004 Nguyen et al.
2004/0060514 A1 4/2004 Janakiraman et al.
2004/0061447 A1 4/2004 Saigusa et al.
2004/0069225 A1 4/2004 Fairbairn et al.
2004/0070346 A1 4/2004 Choi
2004/0072446 A1 4/2004 Liu et al.
2004/0076529 A1 4/2004 Gnauck et al.
2004/0083967 A1 5/2004 Yuda et al.
2004/0087139 A1 5/2004 Yeh et al.
2004/0092063 A1 5/2004 Okumura
2004/0099285 A1 5/2004 Wange et al.
2004/0099378 A1 5/2004 Kim et al.
2004/0101667 A1 5/2004 O'Loughlin et al.
2004/0103844 A1 6/2004 Chou et al.
2004/0107908 A1 6/2004 Collins et al.
2004/0108067 A1 6/2004 Fischione et al.
2004/0108068 A1 6/2004 Senzaki et al.
2004/0115876 A1 6/2004 Goundar et al.
2004/0124280 A1 7/2004 Shih et al.
2004/0129671 A1 7/2004 Ji et al.
2004/0137161 A1 7/2004 Segawa et al.
2004/0140053 A1 7/2004 Srivastava et al.
2004/0144311 A1 7/2004 Chen et al.
2004/0144490 A1 7/2004 Zhao et al.
2004/0147126 A1 7/2004 Yamashita et al.
2004/0149223 A1 8/2004 Collison et al.
2004/0149394 A1 8/2004 Doan et al.
2004/0152342 A1 8/2004 Li
2004/0154535 A1 8/2004 Chen et al.
2004/0157444 A1 8/2004 Chiu
2004/0161921 A1 8/2004 Ryu
2004/0175913 A1 9/2004 Johnson et al.
2004/0175929 A1 9/2004 Schmitt et al.
2004/0182315 A1 9/2004 Laflamme et al.
2004/0187787 A1 9/2004 Dawson
2004/0192032 A1 9/2004 Ohmori et al.
2004/0194799 A1 10/2004 Kim et al.
2004/0195216 A1 10/2004 Strang
2004/0200499 A1 10/2004 Harvey
2004/0211357 A1 10/2004 Gadgil et al.
2004/0219723 A1 11/2004 Peng et al.
2004/0219737 A1 11/2004 Quon
2004/0219789 A1 11/2004 Wood et al.
2004/0221809 A1 11/2004 Ohmi et al.
2004/0231706 A1 11/2004 Bhatnagar et al.
2004/0237897 A1 12/2004 Hanawa et al.
2004/0263827 A1 12/2004 Xu
2005/0000432 A1 1/2005 Keller et al.
2005/0001276 A1 1/2005 Gao et al.
2005/0003676 A1 1/2005 Ho et al.
2005/0009340 A1 1/2005 Saijo et al.
2005/0009358 A1 1/2005 Choi et al.
2005/0026430 A1 2/2005 Kim et al.
2005/0026431 A1 2/2005 Kazumi et al.
2005/0035455 A1 2/2005 Hu et al.
2005/0039679 A1 2/2005 Kleshock
2005/0051094 A1 3/2005 Schaepkens et al.
2005/0056218 A1 3/2005 Sun et al.
2005/0073051 A1 4/2005 Yamamoto et al.

(56) References Cited

U.S. PATENT DOCUMENTS

2005/0079706 A1 4/2005 Kumar et al.
2005/0087517 A1 4/2005 Ott et al.
2005/0090078 A1 4/2005 Ishihara
2005/0090120 A1 4/2005 Hasegawa et al.
2005/0098111 A1 5/2005 Shimizu et al.
2005/0103267 A1 5/2005 Hur et al.
2005/0105991 A1 5/2005 Hofmeister et al.
2005/0109279 A1 5/2005 Suzuki
2005/0112876 A1 5/2005 Wu
2005/0112901 A1 5/2005 Ji et al.
2005/0123690 A1 6/2005 Derderian et al.
2005/0136188 A1 6/2005 Chang
2005/0145341 A1 7/2005 Suzuki
2005/0164479 A1 7/2005 Perng et al.
2005/0167394 A1 8/2005 Liu et al.
2005/0176258 A1 8/2005 Hirose et al.
2005/0178746 A1 8/2005 Gorin
2005/0181588 A1 8/2005 Kim
2005/0183666 A1 8/2005 Tsuji et al.
2005/0194094 A1 9/2005 Yasaka
2005/0196967 A1 9/2005 Savas et al.
2005/0199489 A1 9/2005 Stevens et al.
2005/0205110 A1 9/2005 Kao et al.
2005/0205862 A1 9/2005 Koemtzopoulos et al.
2005/0208215 A1 9/2005 Eguchi et al.
2005/0208217 A1 9/2005 Shinriki et al.
2005/0214477 A1 9/2005 Hanawa et al.
2005/0218507 A1 10/2005 Kao et al.
2005/0219786 A1 10/2005 Brown et al.
2005/0221552 A1 10/2005 Kao et al.
2005/0224181 A1 10/2005 Merry et al.
2005/0229848 A1 10/2005 Shinriki et al.
2005/0230350 A1 10/2005 Kao et al.
2005/0236694 A1 10/2005 Wu et al.
2005/0238807 A1 10/2005 Lin et al.
2005/0239282 A1 10/2005 Chen et al.
2005/0251990 A1 11/2005 Choi et al.
2005/0266622 A1 12/2005 Arghavani et al.
2005/0266650 A1 12/2005 Ahn et al.
2005/0266691 A1 12/2005 Gu et al.
2005/0269030 A1 12/2005 Kent et al.
2005/0274324 A1 12/2005 Takahashi et al.
2005/0279454 A1 12/2005 Snijders
2005/0283321 A1 12/2005 Yue et al.
2005/0287688 A1 12/2005 Won et al.
2005/0287755 A1 12/2005 Bachmann
2005/0287771 A1 12/2005 Seamons et al.
2006/0000802 A1 1/2006 Kumar et al.
2006/0000805 A1 1/2006 Todorow et al.
2006/0005856 A1 1/2006 Sun et al.
2006/0005930 A1 1/2006 Ikeda et al.
2006/0006057 A1 1/2006 Laermer
2006/0008676 A1 1/2006 Ebata et al.
2006/0011298 A1 1/2006 Lim et al.
2006/0011299 A1 1/2006 Condrashoff et al.
2006/0016783 A1 1/2006 Wu et al.
2006/0019456 A1 1/2006 Bu et al.
2006/0019477 A1 1/2006 Hanawa et al.
2006/0019486 A1 1/2006 Yu et al.
2006/0021574 A1 2/2006 Armour et al.
2006/0021701 A1 2/2006 Tobe et al.
2006/0021703 A1 2/2006 Umotoy et al.
2006/0024954 A1 2/2006 Wu et al.
2006/0024956 A1 2/2006 Zhijian et al.
2006/0033678 A1 2/2006 Lubomirsky et al.
2006/0040055 A1 2/2006 Nguyen et al.
2006/0043066 A1 3/2006 Kamp
2006/0046412 A1 3/2006 Nguyen et al.
2006/0046419 A1 3/2006 Sandhu et al.
2006/0046470 A1 3/2006 Becknell
2006/0051966 A1 3/2006 Or et al.
2006/0051968 A1 3/2006 Joshi et al.
2006/0054184 A1 3/2006 Mozetic et al.
2006/0057828 A1 3/2006 Omura et al.
2006/0060942 A1 3/2006 Minixhofer et al.
2006/0065629 A1 3/2006 Chen et al.
2006/0073349 A1 4/2006 Aihara et al.
2006/0076108 A1 4/2006 Holland et al.
2006/0087644 A1 4/2006 McMillin et al.
2006/0090700 A1 5/2006 Satoh et al.
2006/0093756 A1 5/2006 Rajagopalan et al.
2006/0097397 A1 5/2006 Russell et al.
2006/0102076 A1 5/2006 Smith et al.
2006/0102587 A1 5/2006 Kimura
2006/0113038 A1 6/2006 Gondhalekar et al.
2006/0118178 A1 6/2006 Desbiolles et al.
2006/0118240 A1 6/2006 Holber et al.
2006/0121724 A1 6/2006 Yue et al.
2006/0124151 A1 6/2006 Yamasaki et al.
2006/0124242 A1 6/2006 Kanarik et al.
2006/0130971 A1 6/2006 Chang et al.
2006/0151115 A1 7/2006 Kim et al.
2006/0157449 A1 7/2006 Takahashi et al.
2006/0162661 A1 7/2006 Jung et al.
2006/0166107 A1 7/2006 Chen et al.
2006/0166515 A1 7/2006 Karim et al.
2006/0169327 A1 8/2006 Shajii et al.
2006/0169410 A1 8/2006 Maeda et al.
2006/0178008 A1 8/2006 Yeh et al.
2006/0183270 A1 8/2006 Humpston
2006/0185592 A1 8/2006 Matsuura
2006/0191479 A1 8/2006 Mizukami et al.
2006/0191637 A1 8/2006 Zajac et al.
2006/0207504 A1 9/2006 Hasebe et al.
2006/0207595 A1 9/2006 Ohmi et al.
2006/0207971 A1 9/2006 Moriya et al.
2006/0210713 A1 9/2006 Brcka
2006/0210723 A1 9/2006 Ishizaka
2006/0215347 A1 9/2006 Wakabayashi et al.
2006/0216878 A1 9/2006 Lee
2006/0219360 A1 10/2006 Iwasaki
2006/0222481 A1 10/2006 Foree
2006/0226121 A1 10/2006 Aoi
2006/0228889 A1 10/2006 Edelberg et al.
2006/0240661 A1 10/2006 Annapragada et al.
2006/0244107 A1 11/2006 Sugihara
2006/0245852 A1 11/2006 Iwabuchi
2006/0246217 A1 11/2006 Weidman et al.
2006/0251800 A1 11/2006 Weidman et al.
2006/0251801 A1 11/2006 Weidman et al.
2006/0252252 A1 11/2006 Zhu et al.
2006/0252265 A1 11/2006 Jin et al.
2006/0254716 A1 11/2006 Mosden et al.
2006/0260750 A1 11/2006 Rueger
2006/0261490 A1 11/2006 Su et al.
2006/0264043 A1 11/2006 Stewart et al.
2006/0266288 A1 11/2006 Choi
2006/0286774 A1 12/2006 Singh et al.
2006/0289384 A1 12/2006 Pavel et al.
2006/0292846 A1 12/2006 Pinto et al.
2007/0022952 A1 2/2007 Ritchie et al.
2007/0025907 A1 2/2007 Rezeq
2007/0039548 A1 2/2007 Johnson
2007/0048977 A1 3/2007 Lee et al.
2007/0051471 A1 3/2007 Kawaguchi et al.
2007/0056925 A1 3/2007 Liu et al.
2007/0062453 A1 3/2007 Ishikawa
2007/0066084 A1 3/2007 Wajda et al.
2007/0071888 A1 3/2007 Shanmugasundram et al.
2007/0072408 A1 3/2007 Enomoto et al.
2007/0077737 A1 4/2007 Kobayashi
2007/0079758 A1 4/2007 Holland et al.
2007/0090325 A1 4/2007 Hwang et al.
2007/0099428 A1 5/2007 Shamiryan et al.
2007/0099431 A1 5/2007 Li
2007/0099438 A1 5/2007 Ye et al.
2007/0107750 A1 5/2007 Sawin et al.
2007/0108404 A1 5/2007 Stewart et al.
2007/0111519 A1 5/2007 Lubomirsky et al.
2007/0117396 A1 5/2007 Wu et al.
2007/0119370 A1 5/2007 Ma et al.
2007/0119371 A1 5/2007 Ma et al.
2007/0123051 A1 5/2007 Arghavani et al.
2007/0128864 A1 6/2007 Ma

(56) References Cited

U.S. PATENT DOCUMENTS

| | | | |
|---|---|---|---|
| 2007/0131274 | A1 | 6/2007 | Stollwerck et al. |
| 2007/0145023 | A1 | 6/2007 | Holber et al. |
| 2007/0154838 | A1 | 7/2007 | Lee |
| 2007/0163440 | A1 | 7/2007 | Kim et al. |
| 2007/0175861 | A1 | 8/2007 | Hwang et al. |
| 2007/0181057 | A1 | 8/2007 | Lam et al. |
| 2007/0193515 | A1 | 8/2007 | Jeon et al. |
| 2007/0197028 | A1 | 8/2007 | Byun et al. |
| 2007/0207275 | A1 | 9/2007 | Nowak et al. |
| 2007/0212288 | A1 | 9/2007 | Holst |
| 2007/0221620 | A1 | 9/2007 | Sakthivel et al. |
| 2007/0227554 | A1 | 10/2007 | Satoh et al. |
| 2007/0231109 | A1 | 10/2007 | Pak et al. |
| 2007/0232071 | A1 | 10/2007 | Balseanu et al. |
| 2007/0235134 | A1 | 10/2007 | Limuro |
| 2007/0238199 | A1 | 10/2007 | Yamashita |
| 2007/0238321 | A1 | 10/2007 | Futase et al. |
| 2007/0243685 | A1 | 10/2007 | Jiang et al. |
| 2007/0243714 | A1 | 10/2007 | Shin et al. |
| 2007/0254169 | A1 | 11/2007 | Kamins et al. |
| 2007/0259467 | A1 | 11/2007 | Tweet et al. |
| 2007/0264820 | A1 | 11/2007 | Liu |
| 2007/0266946 | A1 | 11/2007 | Choi |
| 2007/0277734 | A1 | 12/2007 | Lubomirsky et al. |
| 2007/0280816 | A1 | 12/2007 | Kurita et al. |
| 2007/0281106 | A1 | 12/2007 | Lubomirsky et al. |
| 2007/0287292 | A1 | 12/2007 | Li et al. |
| 2007/0296967 | A1 | 12/2007 | Gupta et al. |
| 2008/0003836 | A1 | 1/2008 | Nishimura et al. |
| 2008/0017104 | A1 | 1/2008 | Matyushkin et al. |
| 2008/0020570 | A1 | 1/2008 | Naik |
| 2008/0035608 | A1 | 2/2008 | Thomas et al. |
| 2008/0044593 | A1 | 2/2008 | Seo et al. |
| 2008/0044990 | A1 | 2/2008 | Lee |
| 2008/0050538 | A1 | 2/2008 | Hirata |
| 2008/0063810 | A1 | 3/2008 | Park et al. |
| 2008/0075668 | A1 | 3/2008 | Goldstein |
| 2008/0081483 | A1 | 4/2008 | Wu |
| 2008/0085604 | A1 | 4/2008 | Hoshino et al. |
| 2008/0099147 | A1 | 5/2008 | Myo et al. |
| 2008/0099431 | A1 | 5/2008 | Kumar et al. |
| 2008/0099876 | A1 | 5/2008 | Seto |
| 2008/0100222 | A1 | 5/2008 | Lewington et al. |
| 2008/0102570 | A1 | 5/2008 | Fischer et al. |
| 2008/0102640 | A1 | 5/2008 | Hassan et al. |
| 2008/0102646 | A1 | 5/2008 | Kawaguchi et al. |
| 2008/0104782 | A1 | 5/2008 | Hughes |
| 2008/0105555 | A1 | 5/2008 | Iwazaki et al. |
| 2008/0115726 | A1 | 5/2008 | Ingle et al. |
| 2008/0121970 | A1 | 5/2008 | Aritome |
| 2008/0124937 | A1 | 5/2008 | Xu et al. |
| 2008/0142831 | A1 | 6/2008 | Su |
| 2008/0153306 | A1 | 6/2008 | Cho et al. |
| 2008/0156631 | A1 | 7/2008 | Fair et al. |
| 2008/0156771 | A1 | 7/2008 | Jeon et al. |
| 2008/0157225 | A1 | 7/2008 | Datta et al. |
| 2008/0160210 | A1 | 7/2008 | Yang et al. |
| 2008/0169588 | A1 | 7/2008 | Shih et al. |
| 2008/0171407 | A1 | 7/2008 | Nakabayashi et al. |
| 2008/0173906 | A1 | 7/2008 | Zhu |
| 2008/0176412 | A1 | 7/2008 | Komeda |
| 2008/0178797 | A1 | 7/2008 | Fodor et al. |
| 2008/0178805 | A1 | 7/2008 | Paterson et al. |
| 2008/0182381 | A1 | 7/2008 | Kiyotoshi |
| 2008/0182382 | A1 | 7/2008 | Ingle et al. |
| 2008/0182383 | A1 | 7/2008 | Lee et al. |
| 2008/0196666 | A1 | 8/2008 | Toshima |
| 2008/0202688 | A1 | 8/2008 | Wu et al. |
| 2008/0202892 | A1 | 8/2008 | Smith et al. |
| 2008/0216901 | A1 | 9/2008 | Chamberlain et al. |
| 2008/0216958 | A1 | 9/2008 | Goto et al. |
| 2008/0230519 | A1 | 9/2008 | Takahashi |
| 2008/0233709 | A1 | 9/2008 | Conti et al. |
| 2008/0236751 | A1 | 10/2008 | Aramaki et al. |
| 2008/0254635 | A1 | 10/2008 | Benzel et al. |
| 2008/0261404 | A1 | 10/2008 | Kozuka et al. |
| 2008/0264337 | A1 | 10/2008 | Sano et al. |
| 2008/0268645 | A1 | 10/2008 | Kao et al. |
| 2008/0292798 | A1 | 11/2008 | Huh et al. |
| 2008/0293248 | A1 | 11/2008 | Park et al. |
| 2009/0000743 | A1 | 1/2009 | Iizuka |
| 2009/0001480 | A1 | 1/2009 | Cheng |
| 2009/0004849 | A1 | 1/2009 | Eun |
| 2009/0004873 | A1 | 1/2009 | Yang |
| 2009/0014127 | A1 | 1/2009 | Shah et al. |
| 2009/0014323 | A1 | 1/2009 | Yendler et al. |
| 2009/0014324 | A1 | 1/2009 | Kawaguchi et al. |
| 2009/0017227 | A1 | 1/2009 | Fu et al. |
| 2009/0036292 | A1 | 2/2009 | Sun et al. |
| 2009/0045167 | A1 | 2/2009 | Maruyama |
| 2009/0072401 | A1 | 3/2009 | Arnold et al. |
| 2009/0081878 | A1 | 3/2009 | Dhindsa |
| 2009/0084317 | A1 | 4/2009 | Wu et al. |
| 2009/0087960 | A1 | 4/2009 | Cho et al. |
| 2009/0087979 | A1 | 4/2009 | Raghuram |
| 2009/0095221 | A1 | 4/2009 | Tam et al. |
| 2009/0095222 | A1 | 4/2009 | Tam et al. |
| 2009/0095621 | A1 | 4/2009 | Kao et al. |
| 2009/0098276 | A1 | 4/2009 | Burrows |
| 2009/0098706 | A1 | 4/2009 | Kim et al. |
| 2009/0104738 | A1 | 4/2009 | Ring et al. |
| 2009/0104782 | A1 | 4/2009 | Lu et al. |
| 2009/0111280 | A1 | 4/2009 | Kao et al. |
| 2009/0117270 | A1 | 5/2009 | Yamasaki et al. |
| 2009/0120464 | A1 | 5/2009 | Rasheed et al. |
| 2009/0162647 | A1 | 6/2009 | Sun et al. |
| 2009/0170221 | A1 | 7/2009 | Jacques et al. |
| 2009/0170331 | A1 | 7/2009 | Cheng et al. |
| 2009/0179300 | A1 | 7/2009 | Arai |
| 2009/0189246 | A1 | 7/2009 | Wu et al. |
| 2009/0189287 | A1 | 7/2009 | Yang et al. |
| 2009/0191711 | A1 | 7/2009 | Rui et al. |
| 2009/0194233 | A1 | 8/2009 | Tamura |
| 2009/0194810 | A1 | 8/2009 | Kiyotoshi et al. |
| 2009/0197418 | A1 | 8/2009 | Sago |
| 2009/0202721 | A1 | 8/2009 | Nogami et al. |
| 2009/0214825 | A1 | 8/2009 | Sun et al. |
| 2009/0223928 | A1 | 9/2009 | Colpo |
| 2009/0236314 | A1 | 9/2009 | Chen |
| 2009/0255902 | A1 | 10/2009 | Satoh et al. |
| 2009/0258162 | A1 | 10/2009 | Furuta et al. |
| 2009/0269934 | A1 | 10/2009 | Kao et al. |
| 2009/0274590 | A1 | 11/2009 | Willwerth et al. |
| 2009/0275146 | A1 | 11/2009 | Takano et al. |
| 2009/0275205 | A1 | 11/2009 | Kiehlbauch et al. |
| 2009/0275206 | A1 | 11/2009 | Katz et al. |
| 2009/0277587 | A1 | 11/2009 | Lubomirsky et al. |
| 2009/0277874 | A1 | 11/2009 | Rui et al. |
| 2009/0280650 | A1 | 11/2009 | Lubomirsky et al. |
| 2009/0286400 | A1 | 11/2009 | Heo et al. |
| 2009/0286405 | A1 | 11/2009 | Okesaku et al. |
| 2009/0293809 | A1 | 12/2009 | Cho et al. |
| 2009/0294898 | A1 | 12/2009 | Feustel et al. |
| 2009/0317978 | A1 | 12/2009 | Higashi |
| 2009/0320756 | A1 | 12/2009 | Tanaka |
| 2010/0000683 | A1 | 1/2010 | Kadkhodayan et al. |
| 2010/0003824 | A1 | 1/2010 | Kadkhodayan et al. |
| 2010/0006543 | A1 | 1/2010 | Sawada et al. |
| 2010/0022030 | A1 | 1/2010 | Ditizio |
| 2010/0025370 | A1 | 2/2010 | Dieguez-Campo et al. |
| 2010/0039747 | A1 | 2/2010 | Sansoni |
| 2010/0047080 | A1 | 2/2010 | Bruce |
| 2010/0048027 | A1 | 2/2010 | Cheng et al. |
| 2010/0055408 | A1 | 3/2010 | Lee et al. |
| 2010/0055917 | A1 | 3/2010 | Kim |
| 2010/0059889 | A1 | 3/2010 | Gosset et al. |
| 2010/0062603 | A1 | 3/2010 | Ganguly et al. |
| 2010/0075503 | A1 | 3/2010 | Bencher |
| 2010/0081285 | A1 | 4/2010 | Chen et al. |
| 2010/0093151 | A1 | 4/2010 | Arghavani et al. |
| 2010/0093168 | A1 | 4/2010 | Naik |
| 2010/0096367 | A1 | 4/2010 | Jeon et al. |
| 2010/0099236 | A1 | 4/2010 | Kwon et al. |
| 2010/0099263 | A1 | 4/2010 | Kao et al. |

(56) References Cited

U.S. PATENT DOCUMENTS

2010/0101727 A1 4/2010 Ji
2010/0105209 A1 4/2010 Winniczek et al.
2010/0116788 A1 5/2010 Singh et al.
2010/0119843 A1 5/2010 Sun et al.
2010/0129974 A1 5/2010 Futase et al.
2010/0130001 A1 5/2010 Noguchi
2010/0139889 A1 6/2010 Kurita et al.
2010/0144140 A1 6/2010 Chandrashekar et al.
2010/0147219 A1 6/2010 Hsieh et al.
2010/0151149 A1 6/2010 Ovshinsky
2010/0164422 A1 7/2010 Shu et al.
2010/0173499 A1 7/2010 Tao et al.
2010/0178748 A1 7/2010 Subramanian
2010/0178755 A1 7/2010 Lee et al.
2010/0180819 A1 7/2010 Hatanaka et al.
2010/0183825 A1 7/2010 Becker et al.
2010/0187534 A1 7/2010 Nishi et al.
2010/0187588 A1 7/2010 Kim et al.
2010/0187694 A1 7/2010 Yu et al.
2010/0190352 A1 7/2010 Jaiswal
2010/0197143 A1 8/2010 Nishimura
2010/0203739 A1 8/2010 Becker et al.
2010/0207205 A1 8/2010 Grebs et al.
2010/0224324 A1 9/2010 Kasai
2010/0240205 A1 9/2010 Son
2010/0243165 A1 9/2010 Um
2010/0243606 A1 9/2010 Koshimizu
2010/0244204 A1 9/2010 Matsuoka et al.
2010/0252068 A1 10/2010 Kannan et al.
2010/0258913 A1 10/2010 Lue
2010/0267224 A1 10/2010 Choi et al.
2010/0267248 A1 10/2010 Ma et al.
2010/0273290 A1 10/2010 Kryliouk
2010/0273291 A1 10/2010 Kryliouk et al.
2010/0288369 A1 11/2010 Chang et al.
2010/0294199 A1 11/2010 Tran et al.
2010/0310785 A1 12/2010 Sasakawa et al.
2010/0314005 A1 12/2010 Saito et al.
2010/0330814 A1 12/2010 Yokota et al.
2011/0005607 A1 1/2011 Desbiolles et al.
2011/0005684 A1 1/2011 Hayami et al.
2011/0008950 A1 1/2011 Xu
2011/0011338 A1 1/2011 Chuc et al.
2011/0034035 A1 2/2011 Liang et al.
2011/0039407 A1 2/2011 Nishizuka
2011/0045676 A1 2/2011 Park
2011/0048325 A1 3/2011 Choie et al.
2011/0053380 A1 3/2011 Sapre et al.
2011/0058303 A1 3/2011 Migita
2011/0061810 A1 3/2011 Ganguly et al.
2011/0061812 A1 3/2011 Ganguly et al.
2011/0065276 A1 3/2011 Ganguly et al.
2011/0076401 A1 3/2011 Chao et al.
2011/0081782 A1 4/2011 Liang et al.
2011/0100489 A1 5/2011 Orito
2011/0104393 A1 5/2011 Hilkene et al.
2011/0111596 A1 5/2011 Kanakasabapathy
2011/0114601 A1 5/2011 Lubomirsky et al.
2011/0115378 A1 5/2011 Lubomirsky et al.
2011/0124144 A1 5/2011 Schlemm et al.
2011/0127156 A1 6/2011 Foad et al.
2011/0133650 A1 6/2011 Kim
2011/0140229 A1 6/2011 Rachmady et al.
2011/0143542 A1 6/2011 Feurprier et al.
2011/0146909 A1 6/2011 Shi et al.
2011/0147363 A1 6/2011 Yap et al.
2011/0151674 A1 6/2011 Tang et al.
2011/0151677 A1 6/2011 Wang et al.
2011/0151678 A1 6/2011 Ashtiani et al.
2011/0155181 A1 6/2011 Inatomi
2011/0159690 A1 6/2011 Chandrashekar et al.
2011/0165057 A1 7/2011 Honda et al.
2011/0165347 A1 7/2011 Miller et al.
2011/0165771 A1 7/2011 Ring et al.
2011/0174778 A1 7/2011 Sawada et al.
2011/0180847 A1 7/2011 Ikeda et al.
2011/0195575 A1 8/2011 Wang
2011/0198034 A1 8/2011 Sun et al.
2011/0204025 A1 8/2011 Tahara
2011/0207332 A1 8/2011 Liu et al.
2011/0217851 A1 9/2011 Liang et al.
2011/0226734 A1 9/2011 Sumiya et al.
2011/0227028 A1 9/2011 Sekar et al.
2011/0230008 A1 9/2011 Lakshmanan et al.
2011/0230052 A1 9/2011 Tang et al.
2011/0232737 A1 9/2011 Ruletzki et al.
2011/0232845 A1 9/2011 Riker et al.
2011/0244686 A1 10/2011 Aso et al.
2011/0244693 A1 10/2011 Tamura et al.
2011/0256421 A1 10/2011 Bose et al.
2011/0265884 A1 11/2011 Xu et al.
2011/0265887 A1 11/2011 Lee et al.
2011/0265951 A1 11/2011 Xu
2011/0266252 A1 11/2011 Thadani et al.
2011/0266256 A1 11/2011 Cruse et al.
2011/0266682 A1 11/2011 Edelstein et al.
2011/0278260 A1 11/2011 Lai et al.
2011/0287633 A1 11/2011 Lee et al.
2011/0294300 A1 12/2011 Zhang et al.
2011/0298061 A1 12/2011 Siddiqui et al.
2011/0304078 A1 12/2011 Lee et al.
2012/0003782 A1 1/2012 Byun et al.
2012/0009796 A1 1/2012 Cui et al.
2012/0025289 A1 2/2012 Liang et al.
2012/0031559 A1 2/2012 Dhindsa et al.
2012/0034786 A1 2/2012 Dhindsa et al.
2012/0035766 A1 2/2012 Shajii et al.
2012/0037596 A1 2/2012 Eto et al.
2012/0052683 A1 3/2012 Kim et al.
2012/0055402 A1 3/2012 Moriya et al.
2012/0068242 A1 3/2012 Shin et al.
2012/0070982 A1 3/2012 Yu et al.
2012/0070996 A1 3/2012 Hao et al.
2012/0091108 A1 4/2012 Lin et al.
2012/0097330 A1 4/2012 Iyengar et al.
2012/0100720 A1 4/2012 Winniczek et al.
2012/0103518 A1 5/2012 Kakimoto
2012/0104564 A1 5/2012 Won et al.
2012/0119225 A1 5/2012 Shiomi et al.
2012/0122319 A1 5/2012 Shimizu
2012/0129354 A1 5/2012 Luong
2012/0135576 A1 5/2012 Lee et al.
2012/0148369 A1 6/2012 Michalski et al.
2012/0149200 A1 6/2012 Culp et al.
2012/0161405 A1 6/2012 Mohn et al.
2012/0164839 A1 6/2012 Nishimura
2012/0171852 A1 7/2012 Yuan et al.
2012/0180954 A1 7/2012 Yang et al.
2012/0181599 A1 7/2012 Lung
2012/0182808 A1 7/2012 Lue et al.
2012/0187844 A1 7/2012 Hoffman et al.
2012/0196447 A1 8/2012 Yang et al.
2012/0196451 A1 8/2012 Mallick
2012/0202408 A1 8/2012 Shajii et al.
2012/0208361 A1 8/2012 Ha
2012/0211462 A1 8/2012 Zhang et al.
2012/0211722 A1 8/2012 Kellam et al.
2012/0222616 A1 9/2012 Han et al.
2012/0222815 A1 9/2012 Sabri et al.
2012/0223048 A1 9/2012 Paranjpe et al.
2012/0223418 A1 9/2012 Stowers et al.
2012/0225557 A1 9/2012 Serry et al.
2012/0228642 A1 9/2012 Aube et al.
2012/0234945 A1 9/2012 Olgado
2012/0238102 A1 9/2012 Zhang et al.
2012/0238103 A1 9/2012 Zhang et al.
2012/0238108 A1 9/2012 Chen et al.
2012/0241411 A1 9/2012 Darling et al.
2012/0247390 A1 10/2012 Sawada et al.
2012/0247670 A1 10/2012 Dobashi et al.
2012/0247671 A1 10/2012 Sugawara
2012/0247677 A1 10/2012 Himori et al.
2012/0255491 A1 10/2012 Hahidi
2012/0258600 A1 10/2012 Godet et al.

(56) References Cited

U.S. PATENT DOCUMENTS

2012/0267346 A1 10/2012 Kao et al.
2012/0269968 A1 10/2012 Rayner
2012/0282779 A1 11/2012 Arnold et al.
2012/0285619 A1 11/2012 Matyushkin et al.
2012/0285621 A1 11/2012 Tan
2012/0291696 A1 11/2012 Clarke
2012/0292664 A1 11/2012 Kanike
2012/0304933 A1 12/2012 Mai et al.
2012/0309204 A1 12/2012 Kang et al.
2012/0309205 A1 12/2012 Wang et al.
2012/0322015 A1 12/2012 Kim
2013/0001899 A1 1/2013 Hwang et al.
2013/0005103 A1 1/2013 Liu et al.
2013/0005140 A1 1/2013 Jeng et al.
2013/0012030 A1 1/2013 Lakshmanan et al.
2013/0012032 A1 1/2013 Liu et al.
2013/0023062 A1 1/2013 Masuda et al.
2013/0023124 A1 1/2013 Nemani et al.
2013/0026135 A1 1/2013 Kim
2013/0032574 A1 2/2013 Liu et al.
2013/0034666 A1 2/2013 Liang et al.
2013/0034968 A1 2/2013 Zhang et al.
2013/0037919 A1 2/2013 Sapra et al.
2013/0045605 A1 2/2013 Wang et al.
2013/0052804 A1 2/2013 Song
2013/0052827 A1 2/2013 Wang et al.
2013/0052833 A1 2/2013 Ranjan et al.
2013/0059440 A1 3/2013 Wang et al.
2013/0062675 A1 3/2013 Thomas
2013/0065398 A1 3/2013 Ohsawa et al.
2013/0082197 A1 4/2013 Yang et al.
2013/0084654 A1 4/2013 Gaylord et al.
2013/0087309 A1 4/2013 Volfovski
2013/0089988 A1 4/2013 Wang et al.
2013/0098868 A1 4/2013 Nishimura et al.
2013/0105303 A1 5/2013 Lubomirsky et al.
2013/0105948 A1 5/2013 Kewley
2013/0115372 A1 5/2013 Pavol et al.
2013/0118686 A1 5/2013 Carducci et al.
2013/0119016 A1 5/2013 Kagoshima
2013/0119457 A1 5/2013 Lue et al.
2013/0119483 A1 5/2013 Alptekin et al.
2013/0130507 A1 5/2013 Wang et al.
2013/0150303 A1 6/2013 Kungl et al.
2013/0155568 A1 6/2013 Todorow et al.
2013/0161726 A1 6/2013 Kim et al.
2013/0171810 A1 7/2013 Sun et al.
2013/0175654 A1 7/2013 Muckenhirn et al.
2013/0187220 A1 7/2013 Surthi
2013/0193108 A1 8/2013 Zheng
2013/0213935 A1 8/2013 Liao et al.
2013/0217243 A1 8/2013 Underwood et al.
2013/0224960 A1 8/2013 Payyapilly et al.
2013/0260533 A1 10/2013 Sapre et al.
2013/0260564 A1 10/2013 Sapre et al.
2013/0279066 A1 10/2013 Lubomirsky et al.
2013/0284369 A1 10/2013 Kobayashi et al.
2013/0284370 A1 10/2013 Kobayashi et al.
2013/0284373 A1 10/2013 Sun et al.
2013/0284374 A1 10/2013 Lubomirsky et al.
2013/0286530 A1 10/2013 Lin et al.
2013/0295297 A1 11/2013 Chou et al.
2013/0298942 A1 11/2013 Ren et al.
2013/0302980 A1 11/2013 Chandrashekar et al.
2013/0337655 A1 12/2013 Lee et al.
2013/0343829 A1 12/2013 Benedetti et al.
2014/0004707 A1 1/2014 Thedjoisworo et al.
2014/0004708 A1 1/2014 Thedjoisworo
2014/0008880 A1 1/2014 Miura et al.
2014/0020708 A1 1/2014 Kim et al.
2014/0021673 A1 1/2014 Chen et al.
2014/0026813 A1 1/2014 Wang et al.
2014/0053866 A1 2/2014 Baluja et al.
2014/0057447 A1 2/2014 Yang et al.
2014/0062285 A1 3/2014 Chen
2014/0065827 A1 3/2014 Kang et al.
2014/0065842 A1 3/2014 Anthis et al.
2014/0080308 A1 3/2014 Chen et al.
2014/0080309 A1 3/2014 Park
2014/0080310 A1 3/2014 Chen et al.
2014/0083362 A1 3/2014 Lubomirsky et al.
2014/0087488 A1 3/2014 Nam et al.
2014/0097270 A1 4/2014 Liang et al.
2014/0099794 A1 4/2014 Ingle et al.
2014/0102367 A1 4/2014 Ishibashi
2014/0124364 A1 5/2014 Yoo et al.
2014/0134842 A1 5/2014 Zhange et al.
2014/0134847 A1 5/2014 Seya
2014/0141621 A1 5/2014 Ren et al.
2014/0147126 A1 5/2014 Yamashita et al.
2014/0152312 A1 6/2014 Snow et al.
2014/0154668 A1 6/2014 Chou et al.
2014/0154889 A1 6/2014 Wang et al.
2014/0165912 A1 6/2014 Kao et al.
2014/0166617 A1 6/2014 Chen
2014/0166618 A1 6/2014 Tadigadapa et al.
2014/0186772 A1 7/2014 Pohlers et al.
2014/0190410 A1 7/2014 Kim
2014/0191388 A1 7/2014 Chen
2014/0199850 A1 7/2014 Kim et al.
2014/0199851 A1 7/2014 Nemani et al.
2014/0209245 A1 7/2014 Yamamoto et al.
2014/0225504 A1 8/2014 Kaneko et al.
2014/0227881 A1 8/2014 Lubomirsky et al.
2014/0234466 A1 8/2014 Gao et al.
2014/0248773 A1 9/2014 Tsai et al.
2014/0248780 A1 9/2014 Ingle et al.
2014/0256131 A1 9/2014 Wang et al.
2014/0256145 A1 9/2014 Abdallah et al.
2014/0262031 A1 9/2014 Belostotskiy et al.
2014/0262038 A1 9/2014 Wang et al.
2014/0263172 A1 9/2014 Xie et al.
2014/0263272 A1 9/2014 Duan et al.
2014/0264533 A1 9/2014 Simsek-Ege
2014/0271097 A1 9/2014 Wang et al.
2014/0273373 A1 9/2014 Makala et al.
2014/0273406 A1 9/2014 Wang et al.
2014/0273451 A1 9/2014 Wang et al.
2014/0273462 A1 9/2014 Simsek-Ege et al.
2014/0273487 A1 9/2014 Deshmukh et al.
2014/0273489 A1 9/2014 Wang et al.
2014/0273491 A1 9/2014 Zhang et al.
2014/0273492 A1 9/2014 Anthis et al.
2014/0273496 A1 9/2014 Kao
2014/0288528 A1 9/2014 Py et al.
2014/0302678 A1 10/2014 Paterson et al.
2014/0302680 A1 10/2014 Singh
2014/0308758 A1 10/2014 Nemani et al.
2014/0308816 A1 10/2014 Wang et al.
2014/0311581 A1 10/2014 Belostotskiy et al.
2014/0342532 A1 11/2014 Zhu
2014/0342569 A1 11/2014 Zhu et al.
2014/0349477 A1 11/2014 Chandrashekar et al.
2014/0357083 A1 12/2014 Ling et al.
2014/0361684 A1 12/2014 Ikeda et al.
2014/0363979 A1 12/2014 Or et al.
2015/0011096 A1 1/2015 Chandrasekharan et al.
2015/0014152 A1 1/2015 Hoinkis et al.
2015/0031211 A1 1/2015 Sapre et al.
2015/0037980 A1 2/2015 Rha
2015/0041430 A1 2/2015 Yoshino et al.
2015/0050812 A1 2/2015 Smith
2015/0060265 A1 3/2015 Cho et al.
2015/0064918 A1 3/2015 Ranjan et al.
2015/0072508 A1 3/2015 Or et al.
2015/0076110 A1 3/2015 Wu et al.
2015/0076586 A1 3/2015 Rabkin et al.
2015/0079797 A1 3/2015 Chen et al.
2015/0093891 A1 4/2015 Zope
2015/0118822 A1 4/2015 Zhang et al.
2015/0118858 A1 4/2015 Takaba
2015/0126035 A1 5/2015 Diao et al.
2015/0126039 A1 5/2015 Korolik et al.
2015/0126040 A1 5/2015 Korolik et al.

(56) References Cited

U.S. PATENT DOCUMENTS

| | | | |
|---|---|---|---|
| 2015/0129541 | A1 | 5/2015 | Wang et al. |
| 2015/0129545 | A1 | 5/2015 | Ingle et al. |
| 2015/0129546 | A1 | 5/2015 | Ingle et al. |
| 2015/0132953 | A1 | 5/2015 | Nowling |
| 2015/0132968 | A1 | 5/2015 | Ren et al. |
| 2015/0152072 | A1 | 6/2015 | Cantat et al. |
| 2015/0155177 | A1 | 6/2015 | Zhang et al. |
| 2015/0170879 | A1 | 6/2015 | Nguyen et al. |
| 2015/0170920 | A1 | 6/2015 | Purayath et al. |
| 2015/0170924 | A1 | 6/2015 | Nguyen et al. |
| 2015/0170926 | A1 | 6/2015 | Michalak |
| 2015/0170935 | A1 | 6/2015 | Wang et al. |
| 2015/0170943 | A1 | 6/2015 | Nguyen et al. |
| 2015/0171008 | A1 | 6/2015 | Luo |
| 2015/0179464 | A1 | 6/2015 | Wang et al. |
| 2015/0187625 | A1 | 7/2015 | Busche et al. |
| 2015/0200042 | A1 | 7/2015 | Ling et al. |
| 2015/0206764 | A1 | 7/2015 | Wang et al. |
| 2015/0214066 | A1 | 7/2015 | Luere et al. |
| 2015/0214067 | A1 | 7/2015 | Zhang et al. |
| 2015/0214092 | A1 | 7/2015 | Purayath et al. |
| 2015/0214337 | A1 | 7/2015 | Ko et al. |
| 2015/0221479 | A1 | 8/2015 | Chen et al. |
| 2015/0221541 | A1 | 8/2015 | Nemani et al. |
| 2015/0228456 | A1 | 8/2015 | Ye et al. |
| 2015/0235809 | A1 | 8/2015 | Ito et al. |
| 2015/0235860 | A1 | 8/2015 | Tomura et al. |
| 2015/0235863 | A1 | 8/2015 | Chen |
| 2015/0235865 | A1 | 8/2015 | Wang et al. |
| 2015/0235867 | A1 | 8/2015 | Nishizuka |
| 2015/0247231 | A1 | 9/2015 | Nguyen et al. |
| 2015/0249018 | A1 | 9/2015 | Park et al. |
| 2015/0270140 | A1 | 9/2015 | Gupta et al. |
| 2015/0275361 | A1 | 10/2015 | Lubomirsky et al. |
| 2015/0275375 | A1 | 10/2015 | Kim et al. |
| 2015/0279687 | A1 | 10/2015 | Xue et al. |
| 2015/0294980 | A1 | 10/2015 | Lee et al. |
| 2015/0332930 | A1 | 11/2015 | Wang et al. |
| 2015/0340225 | A1 | 11/2015 | Kim et al. |
| 2015/0345029 | A1 | 12/2015 | Wang et al. |
| 2015/0357201 | A1 | 12/2015 | Chen et al. |
| 2015/0357205 | A1 | 12/2015 | Wang et al. |
| 2015/0371861 | A1 | 12/2015 | Li et al. |
| 2015/0371864 | A1 | 12/2015 | Hsu et al. |
| 2015/0371865 | A1 | 12/2015 | Chen et al. |
| 2015/0371866 | A1 | 12/2015 | Chen et al. |
| 2015/0380431 | A1 | 12/2015 | Kanamori et al. |
| 2016/0005572 | A1 | 1/2016 | Liang et al. |
| 2016/0005833 | A1 | 1/2016 | Collins et al. |
| 2016/0027654 | A1 | 1/2016 | Kim et al. |
| 2016/0027673 | A1 | 1/2016 | Wang et al. |
| 2016/0035586 | A1 | 2/2016 | Purayath et al. |
| 2016/0035614 | A1 | 2/2016 | Purayath et al. |
| 2016/0042968 | A1 | 2/2016 | Purayath et al. |
| 2016/0043099 | A1 | 2/2016 | Purayath et al. |
| 2016/0056167 | A1 | 2/2016 | Wang et al. |
| 2016/0064212 | A1 | 3/2016 | Thedjoisworo et al. |
| 2016/0064233 | A1 | 3/2016 | Wang et al. |
| 2016/0079072 | A1 | 3/2016 | Wang et al. |
| 2016/0086772 | A1 | 3/2016 | Khaja |
| 2016/0086807 | A1 | 3/2016 | Park et al. |
| 2016/0086808 | A1 | 3/2016 | Zhang et al. |
| 2016/0086815 | A1 | 3/2016 | Pandit et al. |
| 2016/0086816 | A1 | 3/2016 | Wang et al. |
| 2016/0093505 | A1 | 3/2016 | Chen et al. |
| 2016/0093506 | A1 | 3/2016 | Chen et al. |
| 2016/0093737 | A1 | 3/2016 | Li et al. |
| 2016/0104606 | A1 | 4/2016 | Park et al. |
| 2016/0109863 | A1 | 4/2016 | Valcore et al. |
| 2016/0117425 | A1 | 4/2016 | Povolny et al. |
| 2016/0118227 | A1 | 4/2016 | Valcore et al. |
| 2016/0118268 | A1 | 4/2016 | Ingle et al. |
| 2016/0126118 | A1 | 5/2016 | Chen et al. |
| 2016/0133480 | A1 | 5/2016 | Ko et al. |
| 2016/0148805 | A1 | 5/2016 | Jongbloed et al. |
| 2016/0148821 | A1 | 5/2016 | Singh et al. |
| 2016/0163512 | A1 | 6/2016 | Lubomirsky |
| 2016/0163513 | A1 | 6/2016 | Lubomirsky |
| 2016/0172216 | A1 | 6/2016 | Marakhtanov et al. |
| 2016/0181112 | A1 | 6/2016 | Xue et al. |
| 2016/0181116 | A1 | 6/2016 | Berry et al. |
| 2016/0189933 | A1 | 6/2016 | Kobayashi et al. |
| 2016/0196969 | A1 | 7/2016 | Berry et al. |
| 2016/0196984 | A1 | 7/2016 | Lill et al. |
| 2016/0196985 | A1* | 7/2016 | Tan .................. H01L 21/32136 438/694 |
| 2016/0204009 | A1 | 7/2016 | Nguyen et al. |
| 2016/0218018 | A1 | 7/2016 | Lieu et al. |
| 2016/0222522 | A1 | 8/2016 | Wang et al. |
| 2016/0225651 | A1 | 8/2016 | Tran et al. |
| 2016/0225652 | A1 | 8/2016 | Tran et al. |
| 2016/0237570 | A1 | 8/2016 | Tan et al. |
| 2016/0240389 | A1 | 8/2016 | Zhang et al. |
| 2016/0240402 | A1 | 8/2016 | Park et al. |
| 2016/0260588 | A1 | 9/2016 | Park et al. |
| 2016/0260616 | A1 | 9/2016 | Li et al. |
| 2016/0260619 | A1 | 9/2016 | Zhang et al. |
| 2016/0284556 | A1 | 9/2016 | Ingle et al. |
| 2016/0293438 | A1 | 10/2016 | Zhou et al. |
| 2016/0300694 | A1 | 10/2016 | Yang et al. |
| 2016/0307772 | A1 | 10/2016 | Choi et al. |
| 2016/0307773 | A1 | 10/2016 | Lee et al. |
| 2016/0314961 | A1 | 10/2016 | Liu et al. |
| 2016/0314985 | A1 | 10/2016 | Yang et al. |
| 2016/0319452 | A1 | 11/2016 | Eidschun et al. |
| 2016/0343548 | A1 | 11/2016 | Howald et al. |
| 2017/0040175 | A1 | 2/2017 | Xu et al. |
| 2017/0040190 | A1 | 2/2017 | Benjaminson et al. |
| 2017/0040191 | A1 | 2/2017 | Benjaminson et al. |
| 2017/0040207 | A1 | 2/2017 | Purayath |
| 2017/0040214 | A1 | 2/2017 | Lai et al. |
| 2017/0053808 | A1 | 2/2017 | Kamp et al. |
| 2017/0062184 | A1 | 3/2017 | Tran et al. |
| 2017/0110290 | A1 | 4/2017 | Kobayashi et al. |
| 2017/0110335 | A1 | 4/2017 | Yang et al. |
| 2017/0110475 | A1 | 4/2017 | Liu et al. |
| 2017/0133202 | A1 | 5/2017 | Berry |
| 2017/0178894 | A1 | 6/2017 | Stone et al. |
| 2017/0178899 | A1 | 6/2017 | Kabansky et al. |
| 2017/0178924 | A1 | 6/2017 | Chen et al. |
| 2017/0226637 | A1 | 8/2017 | Lubomirsky et al. |
| 2017/0229287 | A1 | 8/2017 | Xu et al. |
| 2017/0229289 | A1 | 8/2017 | Lubomirsky et al. |
| 2017/0229291 | A1 | 8/2017 | Singh et al. |
| 2017/0229293 | A1 | 8/2017 | Park et al. |
| 2017/0229326 | A1 | 8/2017 | Tran et al. |
| 2017/0229328 | A1 | 8/2017 | Benjaminson et al. |
| 2017/0229329 | A1 | 8/2017 | Benjaminson et al. |
| 2017/0236691 | A1 | 8/2017 | Liang et al. |
| 2017/0236694 | A1 | 8/2017 | Eason et al. |
| 2017/0309509 | A1 | 10/2017 | Tran et al. |
| 2017/0338133 | A1 | 11/2017 | Tan et al. |
| 2017/0338134 | A1 | 11/2017 | Tan et al. |
| 2018/0005850 | A1 | 1/2018 | Citla et al. |
| 2018/0025900 | A1 | 1/2018 | Park et al. |
| 2018/0069000 | A1 | 3/2018 | Bergendahl et al. |
| 2018/0076031 | A1 | 3/2018 | Yan et al. |
| 2018/0076044 | A1 | 3/2018 | Choi et al. |
| 2018/0076083 | A1 | 3/2018 | Ko et al. |
| 2018/0082861 | A1 | 3/2018 | Citla et al. |
| 2018/0096818 | A1 | 4/2018 | Lubomirsky |
| 2018/0096819 | A1 | 4/2018 | Lubomirsky et al. |
| 2018/0096821 | A1 | 4/2018 | Lubomirsky et al. |
| 2018/0096865 | A1 | 4/2018 | Lubomirsky et al. |
| 2018/0102255 | A1 | 4/2018 | Chen et al. |
| 2018/0102256 | A1 | 4/2018 | Chen et al. |
| 2018/0102259 | A1 | 4/2018 | Wang et al. |
| 2018/0138049 | A1 | 5/2018 | Ko et al. |
| 2018/0138055 | A1 | 5/2018 | Xu et al. |
| 2018/0138075 | A1 | 5/2018 | Kang et al. |
| 2018/0138085 | A1 | 5/2018 | Wang et al. |
| 2018/0182633 | A1 | 6/2018 | Pandit et al. |
| 2018/0226223 | A1 | 8/2018 | Lubomirsky |
| 2018/0226230 | A1 | 8/2018 | Kobayashi et al. |

(56) References Cited

U.S. PATENT DOCUMENTS

| | | | |
|---|---|---|---|
| 2018/0226259 | A1 | 8/2018 | Choi et al. |
| 2018/0226278 | A1 | 8/2018 | Arnepalli et al. |
| 2018/0226425 | A1 | 8/2018 | Purayath |
| 2018/0226426 | A1 | 8/2018 | Purayath |
| 2018/0240654 | A1 | 8/2018 | Park et al. |
| 2018/0261516 | A1 | 9/2018 | Lin et al. |
| 2018/0261686 | A1 | 9/2018 | Lin et al. |

FOREIGN PATENT DOCUMENTS

| | | | |
|---|---|---|---|
| CN | 101236893 | A | 8/2008 |
| CN | 101378850 | A | 3/2009 |
| CN | 102893705 | | 1/2013 |
| EP | 1675160 | A1 | 6/2006 |
| JP | S59-126778 | A | 7/1984 |
| JP | S62-45119 | A | 2/1987 |
| JP | 63301051 | A | 12/1988 |
| JP | H01-200627 | A | 8/1989 |
| JP | H02-114525 | A | 4/1990 |
| JP | H07-153739 | A | 6/1995 |
| JP | H8-31755 | A | 2/1996 |
| JP | H08-107101 | A | 4/1996 |
| JP | H08-264510 | A | 10/1996 |
| JP | H09-260356 | A | 10/1997 |
| JP | 2001-313282 | A | 11/2001 |
| JP | 2001-332608 | A | 11/2001 |
| JP | 2002-075972 | A | 3/2002 |
| JP | 2002-083869 | A | 3/2002 |
| JP | 2003-174020 | A | 6/2003 |
| JP | 2003-282591 | A | 10/2003 |
| JP | 2004-508709 | A | 3/2004 |
| JP | 2004-296467 | A | 10/2004 |
| JP | 2005-050908 | A | 2/2005 |
| JP | 2006-041039 | A | 2/2006 |
| JP | 2006-066408 | A | 3/2006 |
| JP | 2008-288560 | A | 11/2008 |
| JP | 4191137 | B2 | 12/2008 |
| JP | 2009-141343 | A | 6/2009 |
| JP | 2009-530871 | A | 8/2009 |
| JP | 2009-239056 | A | 10/2009 |
| JP | 2010-180458 | | 8/2010 |
| JP | 2011-508436 | A | 3/2011 |
| JP | 2011-518408 | A | 6/2011 |
| JP | 4763293 | B2 | 8/2011 |
| JP | 2011-171378 | A | 9/2011 |
| JP | 2012-19164 | A | 1/2012 |
| JP | 2012-019194 | A | 1/2012 |
| JP | 2012-512531 | A | 5/2012 |
| JP | 2013-243418 | A | 12/2013 |
| JP | 5802323 | B2 | 10/2015 |
| JP | 2016-111177 | A | 6/2016 |
| KR | 10-2000-008278 | A | 2/2000 |
| KR | 10-2000-0064946 | A | 11/2000 |
| KR | 10-2001-0056735 | A | 7/2001 |
| KR | 2003-0023964 | A | 3/2003 |
| KR | 10-2003-0054726 | A | 7/2003 |
| KR | 10-2003-0083663 | A | 10/2003 |
| KR | 100441297 | B1 | 7/2004 |
| KR | 10-2005-0007143 | A | 1/2005 |
| KR | 10-2005-0042701 | A | 5/2005 |
| KR | 2005-0049903 | A | 5/2005 |
| KR | 10-2006-0080509 | A | 7/2006 |
| KR | 1006-41762 | B1 | 11/2006 |
| KR | 10-2006-0127173 | A | 12/2006 |
| KR | 100663668 | B1 | 1/2007 |
| KR | 100678696 | B1 | 1/2007 |
| KR | 100712727 | B1 | 4/2007 |
| KR | 2007-0079870 | A | 8/2007 |
| KR | 10-2008-0063988 | A | 7/2008 |
| KR | 10-0843236 | B1 | 7/2008 |
| KR | 10-2009-0040869 | A | 4/2009 |
| KR | 10-2009-0128913 | A | 12/2009 |
| KR | 10-2010-0013980 | A | 2/2010 |
| KR | 10-2010-0093358 | A | 8/2010 |
| KR | 10-2011-0086540 | A | 7/2011 |
| KR | 10-2011-0114538 | A | 10/2011 |
| KR | 10-2011-0126675 | A | 11/2011 |
| KR | 10-2012-0022251 | A | 3/2012 |
| KR | 10-2012-0082640 | A | 7/2012 |
| KR | 10-2016-0002543 | A | 1/2016 |
| TW | 2006-12480 | A | 4/2006 |
| TW | 200709256 | A | 3/2007 |
| TW | 2007-35196 | A | 9/2007 |
| TW | 2011-27983 | A1 | 8/2011 |
| TW | 2012-07919 | | 2/2012 |
| TW | 2012-13594 | A | 4/2012 |
| TW | 2012-33842 | A1 | 8/2012 |
| WO | 2008-112673 | A2 | 9/2008 |
| WO | 2009-084194 | A1 | 7/2009 |
| WO | 2010-010706 | | 1/2010 |
| WO | 2010-113946 | A1 | 10/2010 |
| WO | 2011-027515 | A | 3/2011 |
| WO | 2011-031556 | A | 3/2011 |
| WO | 2011070945 | A1 | 6/2011 |
| WO | 2011-095846 | A1 | 8/2011 |
| WO | 2011-149638 | A | 12/2011 |
| WO | 2012-050321 | A | 4/2012 |
| WO | 2012-118987 | A1 | 9/2012 |
| WO | 2012-125656 | A2 | 9/2012 |
| WO | 2012-148568 | A1 | 11/2012 |
| WO | 2013-118260 | A1 | 8/2013 |

OTHER PUBLICATIONS

International Search Report and Written Opinion of PCT/US2018/016648 dated May 18, 2018, all pages.

H. Xiao, Introduction to Semiconductor Manufacturing Technology, published by Prentice Hall, 2001, ISBN 0-13-022404-9, pp. 354-356.

Manual No. TQMA72E1. “Bayard-Alpert Pirani Gauge FRG-730: Short Operating Instructions” Mar. 2012. Agilent Technologies, Lexington, MA 02421, USA. pp. 1-45.

International Search Report and Written Opinion of PCT/US2016/045551 dated Nov. 17, 2016, all pages.

International Search Report and Written Opinion of PCT/US2016/045543 dated Nov. 17, 2016, all pages.

“Liang et al. Industrial Application of Plasma Process vol. 3, pp. 61-74, 2010”.

Instrument Manual: Vacuum Gauge Model MM200, Rev D. Televac (website: www.televac.com), A Division of the Fredericks Company, Huntingdon Valley, PA, US. 2008. pp. 162.

J.J. Wang and et al., “Inductively coupled plasma etching of bulk 1-20 6H-SiC and thin-film SiCN in NF3 chemistries,” Journal of Vacuum Science & Technology A: Vacuum, Surfaces, and Films 16, 2204 (1998).

International Search Report and Written Opinion of PCT/US2017/047209 dated Nov. 24, 2017, all pages.

International Search Report and Written Opinion of PCT/US2017/033362 dated Aug. 24, 2017, all pages.

International Search Report and Written Opinion of PCT/US2017/060696 dated Jan. 25, 2018, all pages.

International Search Report and Written Opinion of PCT/US2017/055431 dated Jan. 19, 2018, all pages.

Won et al. Derwent 2006-065772; Sep. 7, 2014, 10 pages.

* cited by examiner

SELECTIVE TUNGSTEN REMOVAL

TECHNICAL FIELD

The present technology relates to semiconductor processes and equipment. More specifically, the present technology relates to etching tungsten-containing materials.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process. Such an etch process is said to be selective to the first material. As a result of the diversity of materials, circuits, and processes, etch processes have been developed with a selectivity towards a variety of materials.

Etch processes may be termed wet or dry based on the materials used in the process. A wet HF etch preferentially removes silicon oxide over other dielectrics and materials. However, wet processes may have difficulty penetrating some constrained trenches and also may sometimes deform the remaining material. Dry etches produced in local plasmas formed within the substrate processing region can penetrate more constrained trenches and exhibit less deformation of delicate remaining structures. However, local plasmas may damage the substrate through the production of electric arcs as they discharge.

Thus, there is a need for improved systems and methods that can be used to produce high quality devices and structures. These and other needs are addressed by the present technology.

SUMMARY

Exemplary methods for etching one or more tungsten-containing materials may include flowing a chlorine-containing precursor into a processing region of a semiconductor processing chamber. The etching methods may also include flowing methane into the processing region of the semiconductor processing chamber. The etching methods may include forming a plasma from the chlorine-containing precursor and the methane to produce plasma effluents. The etching methods may further include contacting a substrate with the plasma effluents. The substrate may include an exposed region of a tungsten-containing material. The plasma effluents may produce an oxychloride of tungsten. The etching methods may also include recessing the exposed region of the tungsten-containing material.

In exemplary methods, the tungsten-containing material may include at least one of tungsten oxide or tungsten metal. In some embodiments, the etching methods may remove the tungsten-containing material at a rate of at least about 200 Å per minute. In some embodiments, the etching methods may remove the tungsten-containing material at a rate of at least about 400 Å per minute. The substrate may further include an exposed region of a silicon-containing material. The etching methods may have a selectivity of the tungsten-containing material to the silicon-containing material greater than or about 100:1. The silicon-containing material may define a trench within which at least a portion of the tungsten-containing material may be disposed. The trench may have an aspect ratio of about 10:1 or greater. The etching methods may completely remove at least the portion of the tungsten-containing material disposed within the trench. A temperature of the substrate may be maintained between about 200° C. and about 400° C. during the etching method. The temperature of the substrate may be maintained at about 250° C. during the etching method. A plasma power of the plasma formed from the chlorine-containing precursor and the methane may be at least about 5 W. The plasma power of the plasma formed from the chlorine-containing precursor and the methane may be less than or about 250 W. A pressure within the semiconductor processing chamber may be maintained below or about 3 Torr. In some embodiments, the etching methods may be repeated for at least two cycles. Each of the at least two cycles may last less than or about 30 seconds. A flow rate of the methane may be below or about 30 sccm. The chlorine-containing precursor may include diatomic chlorine. The flow rate of the diatomic chlorine may be about 120 sccm.

The present technology may also include additional exemplary methods of etching one or more tungsten-containing materials. The etching methods may include flowing a chlorine-containing precursor into a processing region of a semiconductor processing chamber. The etching methods may also include flowing a hydrocarbon precursor into the processing region of the semiconductor processing chamber. The etching methods may include forming a plasma from the chlorine-containing precursor and the hydrocarbon precursor to produce plasma effluents. The etching methods may further include contacting a substrate with the plasma effluents. The substrate may include a first region of a tungsten-containing material and a second region of a first silicon-containing material. The etching methods may include selectively etching the first region of the tungsten-containing material relative to the second region of the first silicon-containing material.

In exemplary methods, the plasma effluents may produce an oxychloride of tungsten. The substrate may further include a metal nitride liner interposed between a third region of the tungsten-containing material and a fourth region of a second silicon-containing material. The etching methods may further include selectively etching the metal nitride liner relative to the first and the second silicon-containing material.

The present technology may also include additional exemplary methods of etching one or more tungsten-containing materials. The etching methods may include flowing diatomic chlorine at less than or about 250 sccm into a processing region of a semiconductor processing chamber. The etching method may also include flowing methane at less than or about 50 sccm into the processing region of the semiconductor processing chamber. The etching method may include forming a plasma from the diatomic chlorine and the methane at a plasma power of between about 10 W and about 250 W to produce plasma effluents. The etching methods may further include contacting a substrate with the plasma effluents. The substrate may include an exposed region of a tungsten-containing material and an exposed region of a silicon-containing material. The etching method may include etching the exposed region of the tungsten-containing material at a rate of at least about 400 Å per minute. The etching method may have a selectivity of the tungsten-containing material to the silicon-containing material greater than 100:1. In some embodiments, a temperature of the substrate may be maintained at about 250° C. during the etching of the exposed region of the tungsten-containing material. In some embodiments, a pressure of the semiconductor processing chamber may be maintained at or below about 10 Torr during the etching of the exposed region of the tungsten-containing material.

Such technology may provide numerous benefits over conventional systems and techniques. For example, the etching methods may remove tungsten-containing materials at relatively low temperatures with a high etch rate of the tungsten-containing materials and a high selectivity of the tungsten-containing materials to inter-layer dielectric materials. The etching methods may be controlled to remove tungsten-containing materials from a trench of very high aspect ratios and leave minimal or no residue inside the trench. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
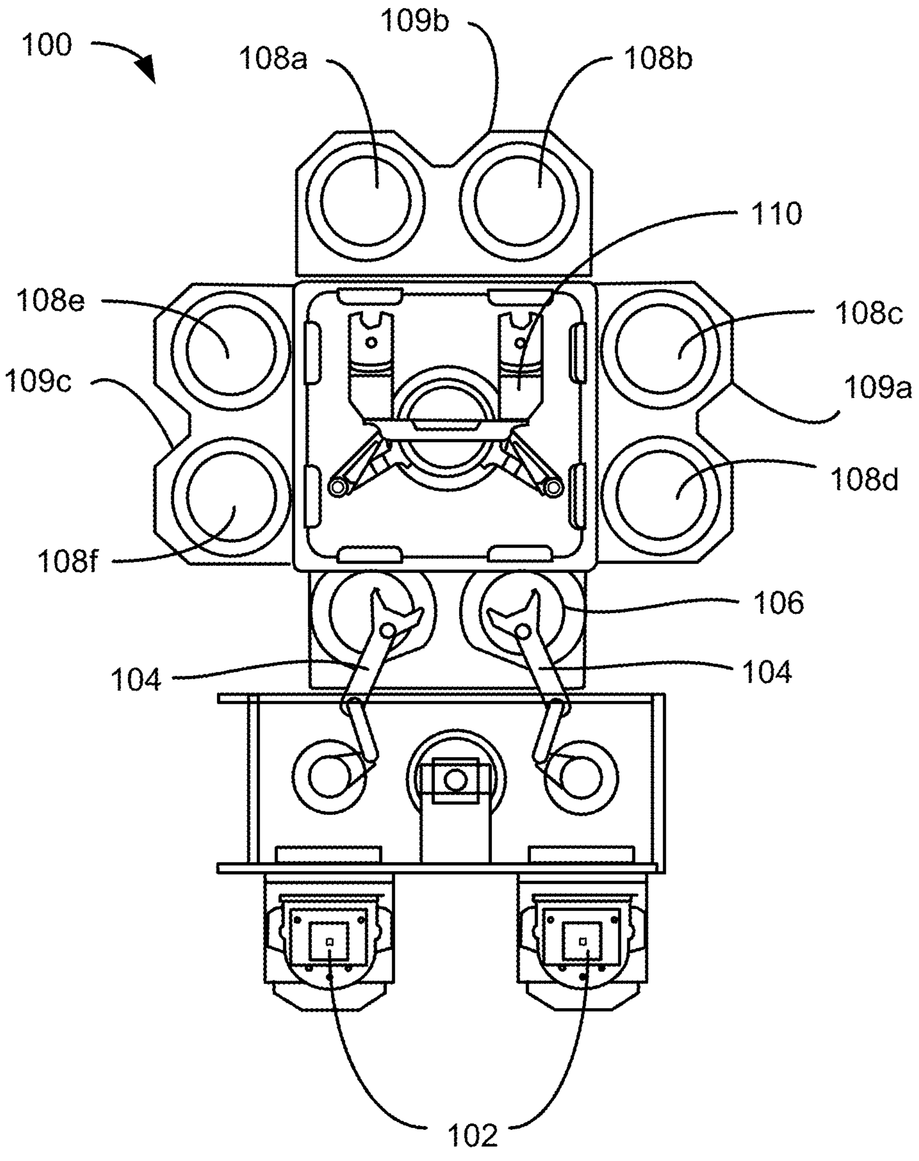
FIG. 1 shows a top plan view of one embodiment of an exemplary processing system according to embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

As semiconductor device features continue to reduce in size, so do the interconnects between the features. The use of tungsten oxide can be advantageous in advanced patterning. However, etching tungsten oxide poses several challenges. For example, the etch rate for tungsten oxide with $NF_3$ is very low, which leads to long processing times. Additionally, high temperatures are generally required for removing tungsten oxide, which may result in removal of inter-layer dielectric materials, causing damages to features formed on a substrate. Moreover, long processing time coupled with high processing temperature used for tungsten-based removal may exceed thermal budgets during mid-line and back-end-of-line processing. Furthermore, given the high aspect ratios of vias and trenches, complete removal of tungsten-containing materials disposed inside a via or trench can be difficult. Any residual material left inside the via or trench after an etching operation may cause peeling of subsequently formed or deposited materials and may affect properties of the materials and the semiconductor device.

The present technology overcomes these issues by providing an etching method that removes tungsten oxide and optionally also removes tungsten metal inside a via or trench. The etching method preserves features formed on the substrate by etching tungsten oxide and/or tungsten metal at low temperatures with a high etch rate and a high selectivity of the tungsten-containing materials over inter-layer dielectric materials. The etching method may be controlled for complete removal of tungsten oxide and/or tungsten metal and leave little or no residue inside the via or trench. Additionally, because the etching method operates at temperatures significantly lower than conventional etching techniques while still offering high etch rates, the present technology can be applied to semiconductor devices characterized by a lower thermal budget.

Although the remaining disclosure will routinely identify specific etching processes utilizing the disclosed technology, it will be readily understood that the systems and methods are equally applicable to deposition and cleaning processes as may occur in the described chambers. Accordingly, the technology should not be considered to be so limited as for use with etching processes or chambers alone. Moreover, although an exemplary chamber is described to provide foundation for the present technology, it is to be understood that the present technology can be applied to virtually any semiconductor processing chamber that may allow the single-chamber operations described.

FIG. 1 shows a top plan view of one embodiment of a processing system 100 of deposition, etching, baking, and curing chambers according to embodiments. In the figure, a pair of front opening unified pods (FOUPs) 102 supply substrates of a variety of sizes that are received by robotic arms 104 and placed into a low pressure holding area 106 before being placed into one of the substrate processing chambers 108*a-f*, positioned in tandem sections 109*a-c*. A second robotic arm 110 may be used to transport the substrate wafers from the holding area 106 to the substrate processing chambers 108*a-f* and back. Each substrate processing chamber 108*a-f*, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation, and other substrate processes.

The substrate processing chambers 108*a-f* may include one or more system components for depositing, annealing, curing and/or etching a dielectric or metallic film on the substrate wafer. In one configuration, two pairs of the processing chambers, e.g., 108*c-d* and 108*e-f*, may be used to deposit material on the substrate, and the third pair of processing chambers, e.g., 108*a-b*, may be used to etch the deposited material. In another configuration, all three pairs of chambers, e.g., 108*a-f*, may be configured to etch a dielectric or metallic film on the substrate. Any one or more of the processes described may be carried out in chamber(s)

separated from the fabrication system shown in different embodiments. It will be appreciated that additional configurations of deposition, etching, annealing, and curing chambers for dielectric films are contemplated by system 100.

Figure 2A:
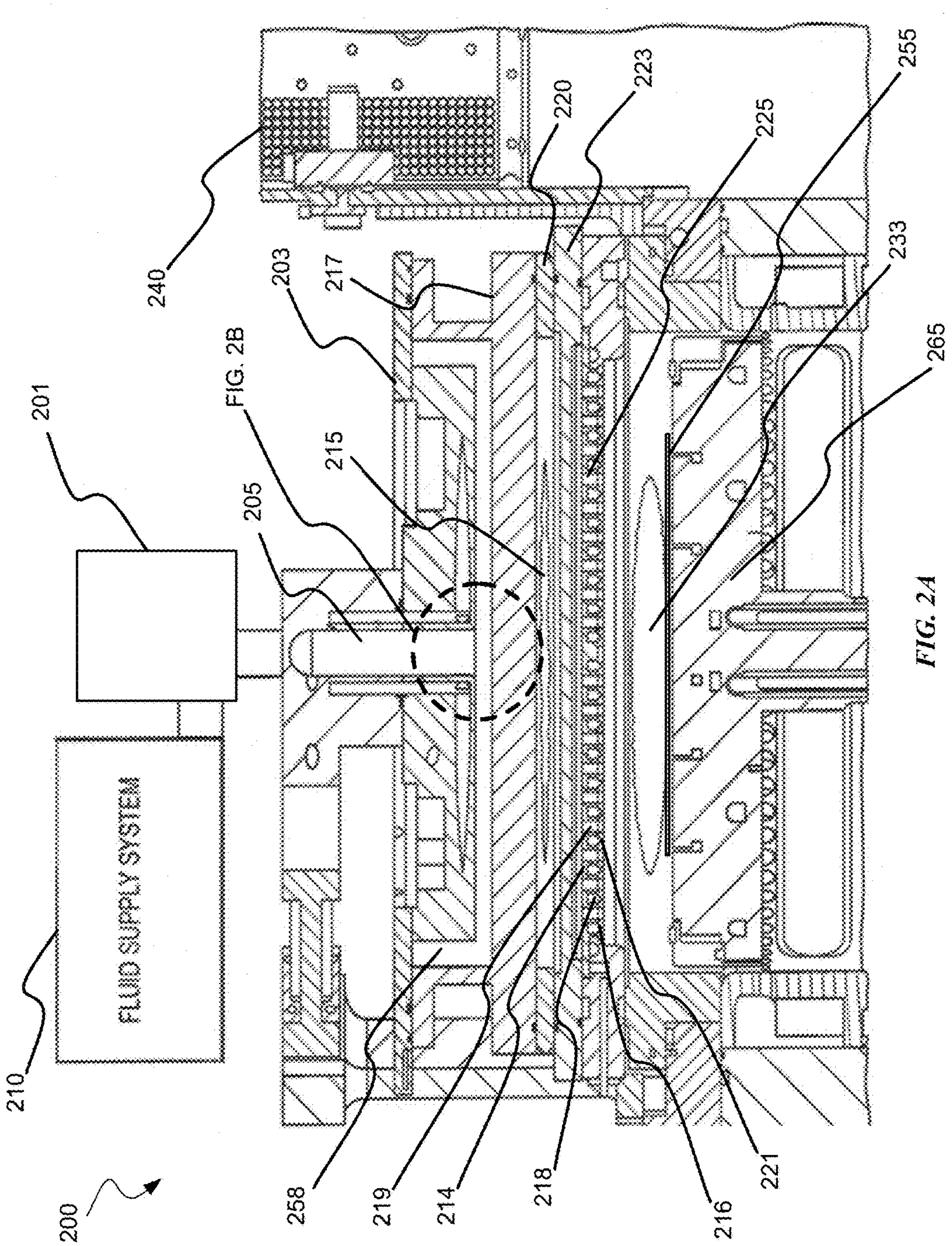
FIG. 2A shows a schematic cross-sectional view of an exemplary processing chamber according to embodiments of the present technology.

FIG. 2A shows a cross-sectional view of an exemplary process chamber system 200 with partitioned plasma generation regions within the processing chamber. During film etching, e.g., titanium nitride, tantalum nitride, tungsten, copper, cobalt, silicon, polysilicon, silicon oxide, silicon nitride, silicon oxynitride, silicon oxycarbide, etc., a process gas may be flowed into the first plasma region 215 through a gas inlet assembly 205. A remote plasma system (RPS) 201 may optionally be included in the system, and may process a first gas which then travels through gas inlet assembly 205. The inlet assembly 205 may include two or more distinct gas supply channels where the second channel (not shown) may bypass the RPS 201, if included.

A cooling plate 203, faceplate 217, ion suppressor 223, showerhead 225, and a substrate support 265, having a substrate 255 disposed thereon, are shown and may each be included according to embodiments. The pedestal 265 may have a heat exchange channel through which a heat exchange fluid flows to control the temperature of the substrate, which may be operated to heat and/or cool the substrate or wafer during processing operations. The wafer support platter of the pedestal 265, which may comprise aluminum, ceramic, or a combination thereof, may also be resistively heated in order to achieve relatively high temperatures, such as from up to or about 100° C. to above or about 600° C., using an embedded resistive heater element.

The faceplate 217 may be pyramidal, conical, or of another similar structure with a narrow top portion expanding to a wide bottom portion. The faceplate 217 may additionally be flat as shown and include a plurality of through-channels used to distribute process gases. Plasma generating gases and/or plasma excited species, depending on use of the RPS 201, may pass through a plurality of holes, shown in FIG. 2B, in faceplate 217 for a more uniform delivery into the first plasma region 215.

Exemplary configurations may include having the gas inlet assembly 205 open into a gas supply region 258 partitioned from the first plasma region 215 by faceplate 217 so that the gases/species flow through the holes in the faceplate 217 into the first plasma region 215. Structural and operational features may be selected to prevent significant backflow of plasma from the first plasma region 215 back into the supply region 258, gas inlet assembly 205, and fluid supply system 210. The faceplate 217, or a conductive top portion of the chamber, and showerhead 225 are shown with an insulating ring 220 located between the features, which allows an AC potential to be applied to the faceplate 217 relative to showerhead 225 and/or ion suppressor 223. The insulating ring 220 may be positioned between the faceplate 217 and the showerhead 225 and/or ion suppressor 223 enabling a capacitively coupled plasma (CCP) to be formed in the first plasma region. A baffle (not shown) may additionally be located in the first plasma region 215, or otherwise coupled with gas inlet assembly 205, to affect the flow of fluid into the region through gas inlet assembly 205.

The ion suppressor 223 may comprise a plate or other geometry that defines a plurality of apertures throughout the structure that are configured to suppress the migration of ionically-charged species out of the first plasma region 215 while allowing uncharged neutral or radical species to pass through the ion suppressor 223 into an activated gas delivery region between the suppressor and the showerhead. In embodiments, the ion suppressor 223 may comprise a perforated plate with a variety of aperture configurations. These uncharged species may include highly reactive species that are transported with less reactive carrier gas through the apertures. As noted above, the migration of ionic species through the holes may be reduced, and in some instances completely suppressed. Controlling the amount of ionic species passing through the ion suppressor 223 may advantageously provide increased control over the gas mixture brought into contact with the underlying wafer substrate, which in turn may increase control of the deposition and/or etch characteristics of the gas mixture. For example, adjustments in the ion concentration of the gas mixture can significantly alter its etch selectivity, e.g., SiNx:SiOx etch ratios, Si:SiOx etch ratios, etc. In alternative embodiments in which deposition is performed, it can also shift the balance of conformal-to-flowable style depositions for dielectric materials.

The plurality of apertures in the ion suppressor 223 may be configured to control the passage of the activated gas, i.e., the ionic, radical, and/or neutral species, through the ion suppressor 223. For example, the aspect ratio of the holes, or the hole diameter to length, and/or the geometry of the holes may be controlled so that the flow of ionically-charged species in the activated gas passing through the ion suppressor 223 is reduced. The holes in the ion suppressor 223 may include a tapered portion that faces the plasma excitation region 215, and a cylindrical portion that faces the showerhead 225. The cylindrical portion may be shaped and dimensioned to control the flow of ionic species passing to the showerhead 225. An adjustable electrical bias may also be applied to the ion suppressor 223 as an additional means to control the flow of ionic species through the suppressor.

The ion suppressor 223 may function to reduce or eliminate the amount of ionically charged species traveling from the plasma generation region to the substrate. Uncharged neutral and radical species may still pass through the openings in the ion suppressor to react with the substrate. It should be noted that the complete elimination of ionically charged species in the reaction region surrounding the substrate may not be performed in embodiments. In certain instances, ionic species are intended to reach the substrate in order to perform the etch and/or deposition process. In these instances, the ion suppressor may help to control the concentration of ionic species in the reaction region at a level that assists the process.

Showerhead 225 in combination with ion suppressor 223 may allow a plasma present in first plasma region 215 to avoid directly exciting gases in substrate processing region 233, while still allowing excited species to travel from chamber plasma region 215 into substrate processing region 233. In this way, the chamber may be configured to prevent the plasma from contacting a substrate 255 being etched. This may advantageously protect a variety of intricate structures and films patterned on the substrate, which may be damaged, dislocated, or otherwise warped if directly contacted by a generated plasma. Additionally, when plasma is allowed to contact the substrate or approach the substrate level, the rate at which oxide species etch may increase. Accordingly, if an exposed region of material is oxide, this material may be further protected by maintaining the plasma remotely from the substrate.

The processing system may further include a power supply 240 electrically coupled with the processing chamber to provide electric power to the faceplate 217, ion suppressor 223, showerhead 225, and/or pedestal 265 to generate a plasma in the first plasma region 215 or processing region 233. The power supply may be configured to deliver an adjustable amount of power to the chamber depending on the process performed. Such a configuration may allow for a tunable plasma to be used in the processes being performed. Unlike a remote plasma unit, which is often presented with on or off functionality, a tunable plasma may be configured to deliver a specific amount of power to the plasma region 215. This in turn may allow development of particular plasma characteristics such that precursors may be dissociated in specific ways to enhance the etching profiles produced by these precursors.

A plasma may be ignited either in chamber plasma region 215 above showerhead 225 or substrate processing region 233 below showerhead 225. Plasma may be present in chamber plasma region 215 to produce the radical precursors from an inflow of, for example, a fluorine-containing precursor or other precursor. An AC voltage typically in the radio frequency (RF) range may be applied between the conductive top portion of the processing chamber, such as faceplate 217, and showerhead 225 and/or ion suppressor 223 to ignite a plasma in chamber plasma region 215 during deposition. An RF power supply may generate a high RF frequency of 13.56 MHz but may also generate other frequencies alone or in combination with the 13.56 MHz frequency.

Figure 2B:
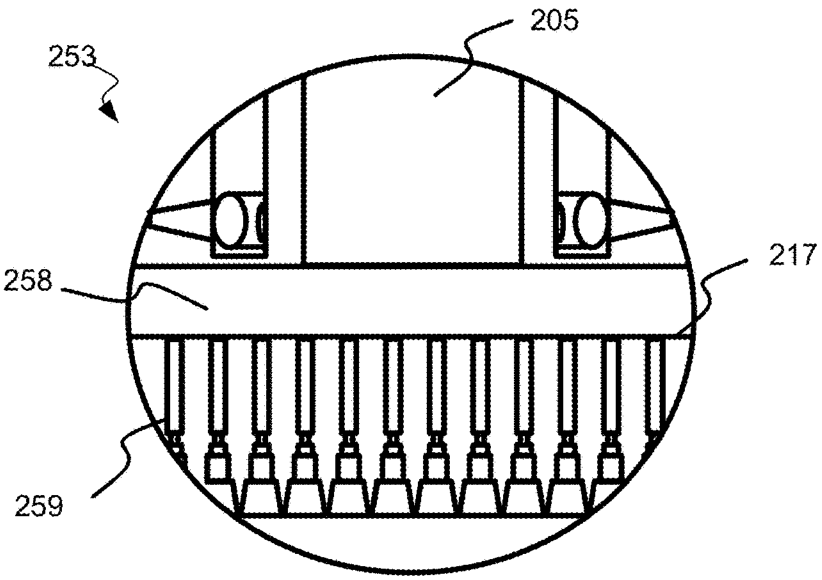
FIG. 2B shows a detailed view of a portion of the processing chamber illustrated in FIG. 2A according to embodiments of the present technology.

FIG. 2B shows a detailed view 253 of the features affecting the processing gas distribution through faceplate 217. As shown in FIGS. 2A and 2B, faceplate 217, cooling plate 203, and gas inlet assembly 205 intersect to define a gas supply region 258 into which process gases may be delivered from gas inlet 205. The gases may fill the gas supply region 258 and flow to first plasma region 215 through apertures 259 in faceplate 217. The apertures 259 may be configured to direct flow in a substantially unidirectional manner such that process gases may flow into processing region 233, but may be partially or fully prevented from backflow into the gas supply region 258 after traversing the faceplate 217.

Figure 3:
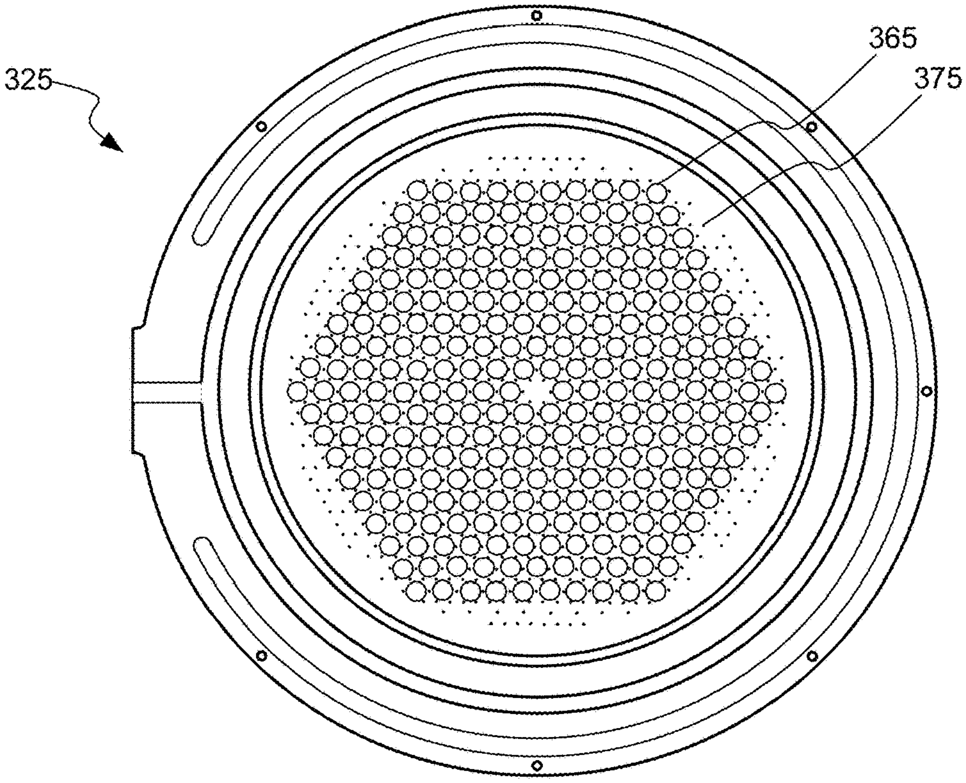
FIG. 3 shows a bottom plan view of an exemplary showerhead according to embodiments of the present technology.

The gas distribution assemblies such as showerhead 225 for use in the processing chamber section 200 may be referred to as dual channel showerheads (DCSH) and are additionally detailed in the embodiments described in FIG. 3. The dual channel showerhead may provide for etching processes that allow for separation of etchants outside of the processing region 233 to provide limited interaction with chamber components and each other prior to being delivered into the processing region.

The showerhead 225 may comprise an upper plate 214 and a lower plate 216. The plates may be coupled with one another to define a volume 218 between the plates. The coupling of the plates may be so as to provide first fluid channels 219 through the upper and lower plates, and second fluid channels 221 through the lower plate 216. The formed channels may be configured to provide fluid access from the volume 218 through the lower plate 216 via second fluid channels 221 alone, and the first fluid channels 219 may be fluidly isolated from the volume 218 between the plates and the second fluid channels 221. The volume 218 may be fluidly accessible through a side of the gas distribution assembly 225.

FIG. 3 is a bottom view of a showerhead 325 for use with a processing chamber according to embodiments. Showerhead 325 may correspond with the showerhead 225 shown in FIG. 2A. Through-holes 365, which show a view of first fluid channels 219, may have a plurality of shapes and configurations in order to control and affect the flow of precursors through the showerhead 225. Small holes 375, which show a view of second fluid channels 221, may be distributed substantially evenly over the surface of the showerhead, even amongst the through-holes 365, and may help to provide more even mixing of the precursors as they exit the showerhead than other configurations.

Figure 4:
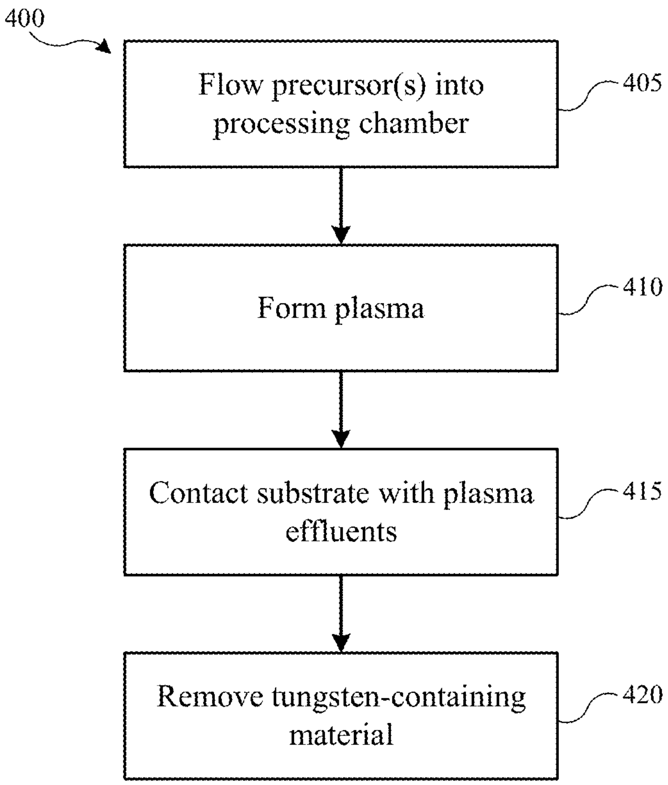
FIG. 4 shows exemplary operations in a method according to embodiments of the present technology.

The chambers discussed previously may be used in performing exemplary methods including etching methods. Turning to FIG. 4, exemplary operations of a method 400 according to embodiments of the present technology are shown. Prior to the first operation of the method, a substrate may be processed in one or more ways before being placed within a processing region of a chamber in which method 400 may be performed. For example, features may be produced, and vias or trenches may be formed or defined within the substrate. The vias or trenches may have an aspect ratio, or a ratio of their height to width, greater than or about 2, greater than or about 5, greater than or about 10, greater than or about 20, greater than or about 30, greater than or about 50, or more in embodiments. The vias or trenches may be formed through or within one or more layers of inter-layer dielectric materials, such as silicon oxide and/or silicon nitride. Thus, the sidewalls of the via or trench may be defined by one or more inter-layer dielectric materials in embodiments. Additionally, a liner material may be formed along the trench sidewalls to protect the substrate from metal diffusion.

Furthermore, one or more tungsten-containing materials may be deposited within a trench. For example, tungsten metal may be deposited within a processing chamber positioned on a processing tool. The chamber in which deposition is performed may be on the same tool as an etching chamber used in method 400, or in embodiments may be on a tool different from the chamber used in method 400. A portion or all of the tungsten metal may be oxidized to form tungsten oxide within the same or a different processing chamber in which deposition is performed. Accordingly, a pillar of tungsten metal, a pillar of tungsten oxide, or a pillar of a combination of tungsten oxide and tungsten metal may be formed within the trench in embodiments. The substrate may then be transferred to a chamber, such as chamber 200 described above, for method 400 to be performed.

Method 400 may include flowing one or more precursors into a processing region of a semiconductor processing chamber at operation 405. The processing region may be region 233 of chamber 200 previously discussed, where the substrate including one or more tungsten-containing materials may be housed. In some embodiments, the one or more precursors may include one or more halogen-containing precursors. In some embodiments, the one or more precursors may further include one or more hydrocarbon precursors. A plasma may be formed at operation 410 within the processing region of the chamber. The plasma may be formed from the one or more halogen-containing precursors and/or the one or more hydrocarbon precursors to produce plasma effluents. The plasma may be formed by two electrodes within the processing chamber, which may include, for example, one or both of the showerhead 225 and the support pedestal 265 previously described. The plasma may be a bias plasma formed within the chamber region that may direct plasma effluents to the substrate surface and provide low-energy ion bombardment to the substrate to assist in the etching or removal of the tungsten-containing materials.

At operation 415, the plasma effluents may contact the substrate. The plasma effluents may include halogen-containing plasma effluents, carbon-containing plasma effluents, and/or hydrogen-containing plasma effluents. The substrate may include one or more exposed regions of the inter-layer dielectric materials and one or more exposed regions of the tungsten-containing materials. The exposed regions of the tungsten-containing materials may include tungsten oxide and/or tungsten metal in embodiments. When contacting the substrate, the plasma effluents may modify and interact with the tungsten-containing materials, while having little to no effect on the inter-layer dielectric materials. The plasma effluents may modify and interact with the tungsten-containing materials to produce volatile substances, such as tungsten oxychloride, which may then be removed from the chamber. At operation 420, at least a portion of the tungsten-containing materials may be selectively removed relative to the inter-layer dielectric materials.

The plasma formed in the processing region with the halogen-containing precursors and/or the hydrocarbon precursors may be a low-power plasma in embodiments to limit the effect on the inter-layer dielectric materials. In embodiments, the plasma power may be below or about 350 W, below or about 300 W, below or about 250 W, below or about 200 W, below or about 150 W, below or about 100 W, below or about 80 W, below or about 60 W, below or about 40 W, below or about 20 W, below or about 10 W, below or about 5 W, or lower. Utilizing a lower plasma power may improve the etch selectivity of the tungsten-containing materials to other exposed structures including the inter-layer dielectric materials. However, utilizing a higher plasma power may offer increased etch rates of the tungsten-containing materials. For example, as the plasma power increases from about 20 W to about 120 W, the etch rate of the tungsten-containing materials may be increased from at least about 100 Å per minute to at least about 700 Å per minute. As the plasma power exceeds 120 W, the increasing effect of the etch rate of the tungsten-containing material resulting from the increase in the plasma power may decrease or may be limited. Therefore, the plasma power may be maintained between about 10 W and about 250 W, between about 20 W and about 120 W, or between about 40 W and about 60 W in embodiments.

The halogen-containing precursors may include chlorine-containing precursors, bromine-containing precursors, fluorine-containing precursors, or other etchants that may interact with the tungsten-containing materials under plasma conditions. The chlorine-containing precursors may include diatomic chlorine ($Cl_2$), or may include chlorine-containing compounds. The chlorine-containing compounds may include chlorine forming an ionic or covalent bonding with other elements. For example, the chlorine-containing compounds may include boron trichloride ($BCl_3$) or tungsten chloride, such as tungsten pentachloride ($WCl_5$). The hydrocarbon precursors may include carbon, hydrogen, and/or nitrogen in any combination. The hydrocarbon precursors may include methyl-containing precursors in embodiments. For example, the hydrocarbon precursors may include methane ($CH_4$). The precursors may include additional carrier gases including chemically inert precursors including helium, argon, xenon, and other noble gases or precursors that may not chemically react with the tungsten-containing materials.

The flow rate of each of the one or more halogen-containing precursors may be less than or about 300 sccm in embodiments, and may be less than or about 250 sccm, less than or about 200 sccm, less than or about 160 sccm, less than or about 120 sccm, less than or about 80 sccm, less than or about 40 sccm, less than or about 20 sccm, less than or about 15 sccm, less than or about 10 sccm, less than or about 5 sccm, or less. The delivery of the halogen-containing precursors may be continuous during the operations of the etching method 400 in embodiments. The delivery of the halogen-containing precursors may be pulsed in embodiments. The delivery of the halogen-containing precursors may be pulsed for time periods of less than or about 60 seconds in embodiments, and may be pulsed for time periods of less than or about 55 seconds, less than or about 50 seconds, less than or about 45 seconds, less than or about 40 seconds, less than or about 35 seconds, less than or about 30 seconds, less than or about 25 seconds, less than or about 20 seconds, less than or about 15 seconds, less than or about 10 seconds, less than or about 5 seconds, or less.

The flow rate of each of the one or more hydrocarbon precursors may be less than or about 50 sccm in embodiments, and may be less than or about 45 sccm, less than or about 40 sccm, less than or about 35 sccm, less than or about 30 sccm, less than or about 25 sccm, less than or about 20 sccm, less than or about 15 sccm, less than or about 10 sccm, less than or about 5 sccm, less than or about 3 sccm, less than or about 1 sccm, or less. The delivery of the hydrocarbon precursors may be continuous during the operations of the etching method 400 in embodiments. The delivery of the hydrocarbon precursors may be pulsed in embodiments. The delivery of the hydrocarbon precursors may be pulsed for time periods of less than or about 60 seconds in embodiments, and may be pulsed for time periods of less than or about 55 seconds, less than or about 50 seconds, less than or about 45 seconds, less than or about 40 seconds, less than or about 35 seconds, less than or about 30 seconds, less than or about 25 seconds, less than or about 20 seconds, less than or about 15 seconds, less than or about 10 seconds, less than or about 5 seconds, or less.

Additionally, the flow rates of the precursors and pulsing may be combined for any of the listed numbers, depending on the desired thickness of the tungsten-containing materials to be removed. For example, the halogen-containing precursor flow rate may be between about 100 sccm and about 150 sccm and may be delivered in pulses from about 15 to about 45 seconds in embodiments. The hydrocarbon precursor flow rate may be below or about 30 sccm and may be delivered in pulses from about 15 to about 45 seconds in embodiments. Flowing the hydrocarbon precursors at lower rates relative to the halogen-containing precursors may limit or avoid carbon deposition on the substrate while achieving desired etching results. In embodiments, the hydrocarbon precursor flow rate may be less than or about 80% of the halogen-containing precursor flow rate, or may be less than or about 60%, less than or about 40%, less than or about 30%, less than or about 20%, less than or about 10%, less than or about 5%, less than or about 3%, or less than or about 1% of the halogen-containing precursor flow rate to achieve effective removal of the tungsten-containing materials.

Optional purge operations may be performed when the delivery of one or more of the precursors is paused to remove volatile tungsten-containing substances, such as tungsten oxychloride. After each purge operation, operations of method 400 may be repeated. Method 400 may represent one cycle of a process for recessing or removing tungsten-containing materials from a substrate. In some embodiments, method 400 may be repeated for at least 2 cycles, and may be repeated for at least 4 cycles, at least 6 cycles, at least 8 cycles, at least 10 cycles, at least 15 cycles, at least 20 cycles, at least 30 cycles, at least 40 cycles, at least 50 cycles, at least 60 cycles, or more. Performing method 400 in multiple cycles may improve selectivity of the tungsten-containing materials, and thereby preserve features on the substrate formed by other materials, such as inter-layer dielectric materials. The number of cycles may also depend on the amount of removal provided by each cycle. The tungsten-containing materials may be removed from a trench completely in a single cycle. In embodiments, flowing the precursors for about 30 seconds in a single cycle may remove at least about 10 nm of the tungsten-containing materials, and may remove at least about 15 nm, at least about 20 nm, at least about 25 nm, at least about 30 nm, at least about 40 nm, at least about 45 nm, at least about 50 nm, or more of the tungsten-containing materials.

As discussed above, the plasma effluents that may interact with the tungsten-containing materials may be formed from one or more halogen-containing precursors, or may be formed from a combination of the one or more halogen-containing precursors and a hydrocarbon precursor in embodiments. For example, the plasma effluents may be formed from tungsten chloride, may be formed from diatomic chlorine, may be formed from a combination of diatomic chlorine and boron trichloride, or may be formed from a combination of diatomic chlorine and methane in embodiments.

To etch the tungsten-containing materials with tungsten chloride, the temperature within the processing chamber or at the substrate level may be maintained at greater than or about 400° C. for the plasma effluents formed from tungsten chloride to interact with and etch the tungsten-containing materials on the substrate. For example, tungsten oxide may be etched at a rate of less than or about 30 Å per minute utilizing the plasma effluents formed from tungsten chloride and maintaining the temperature at about 400° C. However, such etch rate may be relatively low, which may lead to long processing times. Furthermore, as the semiconductor device feature sizes continue to reduce, an operating temperature at above or about 400° C., coupled with an etch rate of less than or about 30 Å per minute, may exceed the thermal budget of the device.

For the plasma effluents formed from one or more precursors that may include diatomic chlorine to interact with and etch the tungsten-containing materials, the temperature within the processing chamber or at the substrate level may be maintained below 400° C. in embodiments. The temperature may be maintained below or about 375° C. in embodiments, and may be maintained below or about 350° C., below or about 300° C., below or about 250° C., below or about 200° C., below or about 150° C., below or about 100° C., or lower. The temperature may also be maintained between about 100° C. and about 400° C. in embodiments, and may be maintained between about 150° C. and about 350° C., or between about 200° C. and about 300° C. during operations of the etching method 400. Volatility of processing byproducts of tungsten-containing materials, such as tungsten-oxide, may be unlikely at temperature ranges below or about 100° C., depending on other process precursors and operating conditions. Accordingly, in some embodiments the temperature during the method 400 may be maintained above or about 200° C., while being maintained below or about 400° C. to ensure operational temperatures do not exceed the processing thermal budget.

In addition to allowing for a lower temperature to achieve effective removal of the tungsten-containing materials, utilizing plasma effluents formed from the precursors including diatomic chlorine may also improve the etch rate of the tungsten-containing materials. For example, contacting the substrate with plasma effluents formed from diatomic chlorine and methane may achieve an etch rate of at least about 100 Å per minute to at least about 700 Å per minute in embodiments where the temperature within the processing chamber or at the substrate level may be maintained below 300° C. in embodiments. Contacting the substrate with plasma effluents formed from diatomic chlorine and methane may etch tungsten metal at an etch rate of at least about 100 Å per minute, at least about 150 Å per minute, at least about 200 Å per minute, at least about 250 Å per minute, at least about 300 Å per minute, at least about 350 Å per minute, or higher. Contacting the substrate with plasma effluents formed from diatomic chlorine and methane may etch tungsten oxide at an etch rate of at least about 200 Å per minute, at least about 250 Å per minute, at least about 300 Å per minute, at least about 350 Å per minute, at least about 400 Å per minute, at least about 450 Å per minute, at least about 500 Å per minute, at least about 550 Å per minute, at least about 600 Å per minute, at least about 650 Å per minute, at least about 700 Å per minute, or higher in embodiments. Tungsten oxide may be etched at a higher rate than tungsten metal in some embodiments due to the relatively weaker bonding structure, allowing plasma effluents to more easily permeate and modify the structure to form volatile substances. Given the high etch rates offered by plasma effluents formed from diatomic chlorine and methane at relatively low temperatures, the present technology may be applied to removal in fabrication of devices characterized by lower thermal budget.

Utilizing plasma effluents formed from diatomic chlorine and boron trichloride may afford etch rates of the tungsten oxide and/or tungsten metal similar to those obtained utilizing plasma effluents formed from diatomic chlorine and methane. However, plasma effluents formed from precursors including boron trichloride may also interact with and etch other materials on the substrate, such as inter-layer dielectric materials. This may be related to boron from the plasma effluents not only breaking the bonding between tungsten and oxygen but also breaking bonds between silicon and oxygen and silicon and nitrogen. Additionally, the plasma effluents formed from precursors including boron trichloride may also exhibit incomplete removal of the tungsten-containing materials.

The plasma effluents formed from diatomic chlorine and methane may limit or avoid etching the inter-layer dielectric materials. Without intending to be bound to any particular theory, carbon from the plasma effluents may break bonding between tungsten and oxygen but may have little to no effect on the bonding between silicon and oxygen and the bonding between silicon and nitrogen. For example, the method utilizing the plasma effluents formed from diatomic chlorine and methane may selectively etch the tungsten-containing materials over silicon nitride and silicon oxide, at an etch rate ratio greater than or about 100:1:1, greater than or about 200:1:1, or higher depending on the operating conditions. With enhanced etch rates and improved selectivity, the method utilizing diatomic chlorine and methane may further improve anisotropic etching of the tungsten-containing materials towards the bottom of the trench, thereby facilitating complete removal of the tungsten-containing materials from the trench while preserving the features on the substrate defined by the inter-layer dielectric materials.

Other process conditions may impact the performance of the operations as well. A pressure within the chamber may be maintained below or about 20 Torr in embodiments. The pressure may be maintained below or about 15 Torr in embodiments, and may be maintained below or about 10 Torr, below or about 5 Torr, below or about 4 Torr, below or about 3 Torr, below or about 2 Torr, below or about 1 Torr, below or about 100 mTorr, or lower. A lower pressure may provide a more anisotropic process. In embodiments the pressure may be maintained between about 500 mTorr and about 3 Torr.

Depending on the temperature and plasma characteristics used in the operations, the present technology may etch liner materials over other substrate materials. For example, the liner may include one or more metals, including transition metals, as well as nitrides of metals. The metals may include, for example, titanium, titanium nitride, tantalum, tantalum nitride, ruthenium, and other materials and nitrides. The present technology may selectively etch the liner materials, such as titanium nitride, over the inter-layer dielectric materials, such as silicon nitride and/or silicon oxide, at an etch rate ratio greater than or about 50:1, and in embodiments greater than or about 100:1, greater than or about 150:1, greater than or about 200:1, or more in embodiments.

Figure 5A:
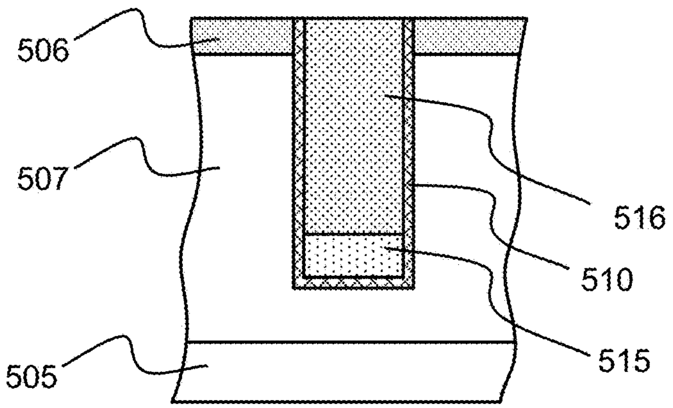
FIGS. 5A-5C show cross-sectional views of substrates being processed according to embodiments of the present technology.
Figure 5B:
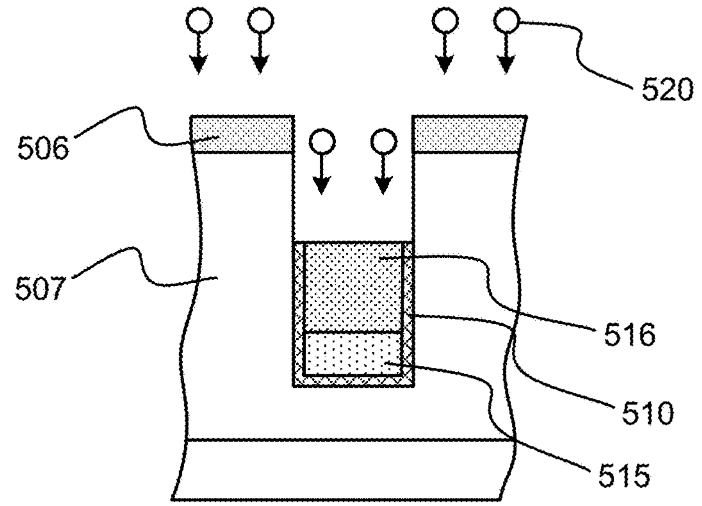
Figure 5C:
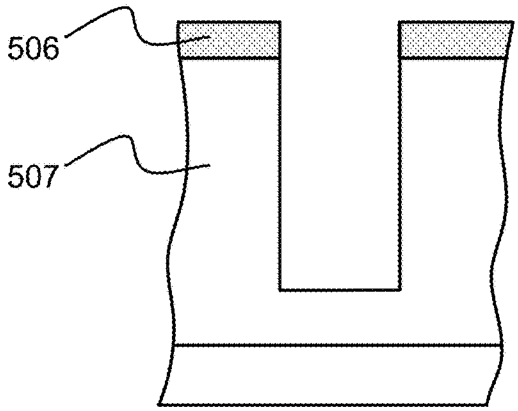

Turning to FIGS. 5A-5C are shown cross-sectional views of substrates on which the present technology may be performed. FIG. 5A illustrates a cross-sectional view of a portion of a substrate 505 on which a trench or via has been formed. The trench may be formed within or through one or more layers formed on the substrate 505. In this embodiment, the trench is formed through a layer of a first inter-layer dielectric material 506, such as silicon oxide, and extends into a layer of a second inter-layer dielectric material 507, such as silicon nitride. In other embodiments, the trench may be formed through or within only one layer or more than two layers of the same or different materials on the substrate 505. The one or more layers of materials may be dielectric materials, metallic materials, or any suitable materials to achieve a desired structure. A liner 510 may be formed within the trench and may produce a barrier on the sidewalls and the substrate. The liner may include titanium nitride, tantalum nitride, other transition metals or transition metal nitrides, and may protect the substrate 505 from metal diffusion. In some embodiments, the substrate may not include a liner or may include more than one liner. One or more tungsten-containing materials may be formed or deposited within the trench and on the liner material 510. In this embodiment, tungsten metal 515 and tungsten oxide 516 are disposed inside the trench with the tungsten metal 515 positioned at the bottom of the trench. In some embodiments, tungsten oxide may be disposed at the bottom of the trench. In some embodiments, only tungsten metal or only tungsten oxide may be disposed inside the trench, or more than one layer of tungsten metal and/or more than one layer of tungsten oxide may be disposed inside the trench.

FIG. 5B illustrates a plasma etching of one or more tungsten-containing materials in which plasma effluents 520 of one or more halogen-containing precursors and/or one or more hydrocarbon precursors are produced. The precursors may be flowed into a substrate processing region where a plasma may be formed to produce the plasma effluents 520. The tungsten oxide 516 and the liner 510 may be contacted with the plasma effluents 520 to produce volatile substances, which may be extracted from the chamber. After the tungsten oxide 516 has been removed, the tungsten metal 515, along with the surrounding liner 510, may be exposed and may be contacted with the plasma effluents 520 to produce volatile substances, which may be extracted from the chamber. The volatile substances produced by the effluents 520 contacting the tungsten-containing materials 515, 516 may include tungsten oxychloride and/or tungsten chloride. As illustrated in FIG. 5C, the plasma effluents may contact and completely remove the tungsten oxide 516, the tungsten metal 515, and the liner 510 from the trench whiling having little or no effect on the first and second inter-layer dielectric materials 506, 507. By utilizing removal methods according to embodiments of the present technology, improved removal of tungsten-containing materials may be performed under restricted thermal budgets, and improved selectivity over other exposed materials, including silicon oxide or silicon nitride, may be achieved.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms “a”, “an”, and “the” include plural references unless the context clearly dictates otherwise. Thus, for example, reference to “a precursor” includes a plurality of such precursors, and reference to “the layer” includes reference to one or more layers and equivalents thereof known to those skilled in the art, and so forth.

Also, the words “comprise(s)”, “comprising”, “contain(s)”, “containing”, “include(s)”, and “including”, when used in this specification and in the following claims, are intended to specify the presence of stated features, integers, components, or operations, but they do not preclude the presence or addition of one or more other features, integers, components, operations, acts, or groups.

The invention claimed is:

1. An etching method comprising:

flowing a chlorine-containing precursor into a processing region of a semiconductor processing chamber;

flowing methane into the processing region of the semiconductor processing chamber;

forming a plasma from the chlorine-containing precursor and the methane to produce plasma effluents;

contacting a substrate with the plasma effluents, wherein the substrate comprises an exposed region of a tungsten-containing material, and wherein the plasma effluents produce an oxychloride of tungsten; and recessing the exposed region of the tungsten-containing material.

2. The etching method of claim 1, wherein the tungsten-containing material comprises at least one of tungsten oxide or tungsten metal.

3. The etching method of claim 1, wherein the etching method removes the tungsten-containing material at a rate of at least about 200 Å per minute.

4. The etching method of claim 3, wherein the etching method removes the tungsten-containing material at a rate of at least about 400 Å per minute.

5. The etching method of claim 1, wherein the substrate further comprises an exposed region of a silicon-containing material, and wherein the etching method has a selectivity of the tungsten-containing material to the silicon-containing material greater than or about 100:1.

6. The etching method of claim 5, wherein the silicon-containing material defines a trench within which at least a portion of the tungsten-containing material is disposed, the trench having an aspect ratio of about 10:1 or greater, and wherein the etching method completely removes at least the portion of the tungsten-containing material disposed within the trench.

7. The etching method of claim 1, wherein a temperature of the substrate is maintained between about 200° C. and about 400° C. during the etching method.

8. The etching method of claim 7, wherein the temperature of the substrate is maintained at about 250° C. during the etching method.

9. The etching method of claim 1, wherein a plasma power of the plasma formed from the chlorine-containing precursor and the methane is at least about 5 W.

10. The etching method of claim 1, wherein a plasma power of the plasma formed from the chlorine-containing precursor and the methane is less than or about 250 W.

11. The etching method of claim 1, wherein a pressure within the semiconductor processing chamber is maintained below or about 3 Torr.

12. The etching method of claim 1, wherein the etching method is repeated for at least two cycles.

13. The etching method of claim 12, wherein each of the at least two cycles lasts less than or about 30 seconds.

14. The etching method of claim 1, wherein a flow rate of the methane is below or about 30 sccm.

15. The etching method of claim 1, wherein the chlorine-containing precursor comprises diatomic chlorine.

16. The etching method of claim 15, wherein a flow rate of the diatomic chlorine is about 120 sccm.

17. An etching method comprising:

flowing a chlorine-containing precursor into a processing region of a semiconductor processing chamber;

flowing a hydrocarbon precursor into the processing region of the semiconductor processing chamber;

forming a plasma from the chlorine-containing precursor and the hydrocarbon precursor to produce plasma effluents;

contacting a substrate with the plasma effluents, wherein the substrate comprises a first region of a tungsten-containing material and a second region of a first silicon-containing material, and wherein the substrate further comprises a metal nitride liner interposed between a third region of the tungsten-containing material and a fourth region of a second silicon-containing material;

selectively etching the first region of the tungsten-containing material relative to the second region of the first silicon-containing material; and selectively etching the metal nitride liner relative to the first and the second silicon-containing material.

18. The etching method of claim 17, wherein the plasma effluents produce an oxychloride of tungsten.

19. An etching method comprising:

flowing diatomic chlorine at less than or about 250 sccm into a processing region of a semiconductor processing chamber;

flowing methane at less than or about 50 sccm into the processing region of the semiconductor processing chamber;

forming a plasma from the diatomic chlorine and the methane at a plasma power of between about 10 W and about 250 W to produce plasma effluents;

contacting a substrate with the plasma effluents, wherein the substrate comprises an exposed region of a tungsten-containing material and an exposed region of a silicon-containing material;

etching the exposed region of the tungsten-containing material at a rate of at least about 400 Å per minute, wherein the etching method has a selectivity of the tungsten-containing material to the silicon-containing material greater than 100:1;

wherein a temperature of the substrate is maintained at about 250° C. during the etching of the exposed region of the tungsten-containing material; and wherein a pressure of the semiconductor processing chamber is maintained at or below about 10 Torr during the etching of the exposed region of the tungsten-containing material.

* * * * *